United States Patent
Hosoya

(10) Patent No.: US 8,039,840 B2
(45) Date of Patent: Oct. 18, 2011

(54) DISPLAY DEVICE AND METHOD FOR MANUFACTURING THE SAME

(75) Inventor: Kunio Hosoya, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 204 days.

(21) Appl. No.: 12/327,107

(22) Filed: Dec. 3, 2008

(65) Prior Publication Data

US 2009/0146150 A1 Jun. 11, 2009

(30) Foreign Application Priority Data

Dec. 5, 2007 (JP) ................................. 2007-314123

(51) Int. Cl.
*H01L 33/00* (2010.01)

(52) U.S. Cl. ............... 257/59; 257/57; 257/72; 257/43; 257/E29.273; 257/E29.291; 257/E33.053; 257/E21.411; 257/E21.414; 438/158; 438/151; 349/39; 349/38

(58) Field of Classification Search ............... 257/57, 257/59, 72, 43, E29.273, E29.291, E33.053, 257/E21.411, E21.414; 438/158, 151, 34; 349/39, 38
See application file for complete search history.

(56) References Cited

U.S. PATENT DOCUMENTS

| | | | |
|---|---|---|---|
| 6,037,197 A | 3/2000 | Yamazaki et al. | |
| 6,087,648 A | 7/2000 | Zhang et al. | |
| 6,165,824 A | 12/2000 | Takano et al. | |
| 6,197,624 B1 | 3/2001 | Yamazaki | |
| 6,294,441 B1 | 9/2001 | Yamazaki | |
| 6,307,214 B1 | 10/2001 | Ohtani et al. | |
| 6,452,211 B1 | 9/2002 | Ohtani et al. | |
| 6,465,288 B1 | 10/2002 | Ohnuma | |
| 6,556,264 B1 | 4/2003 | Hirakata et al. | |
| 6,633,359 B1 * | 10/2003 | Zhang et al. | 349/141 |
| 6,893,503 B1 | 5/2005 | Ohnuma et al. | |
| 7,038,239 B2 | 5/2006 | Murakami et al. | |
| 7,071,037 B2 | 7/2006 | Suzawa et al. | |
| 7,480,024 B2 * | 1/2009 | Kim et al. | 349/141 |
| 7,671,369 B2 | 3/2010 | Yamazaki et al. | |
| 2007/0146566 A1 | 6/2007 | Hosoya | |
| 2007/0212828 A1 * | 9/2007 | Yamazaki et al. | 438/158 |

FOREIGN PATENT DOCUMENTS

| | | |
|---|---|---|
| JP | 2002-116712 | 4/2002 |
| JP | 2002-148658 | 5/2002 |

* cited by examiner

*Primary Examiner* — Benjamin Sandvik
*Assistant Examiner* — Farid Khan
(74) *Attorney, Agent, or Firm* — Husch Blackwell LLP

(57) ABSTRACT

A display device having the high aperture ratio and a storage capacitor with high capacitance is to be obtained. The present invention relates to a display device and a manufacturing method thereof. The display device includes a thin film transistor which includes a gate electrode, a gate insulating film, a first semiconductor layer, a channel protective film, a second semiconductor having conductivity which is divided into a source region and a drain region, and a source electrode and a drain electrode; a third insulating layer formed over the second conductive film; a pixel electrode formed over the third insulating layer, which is connected to one of the source electrode and the drain electrode; and a storage capacitor formed in a region where a capacitor wiring over the first insulating layer and the pixel electrode are overlapped with the third insulating layer over the capacitor wiring interposed therebetween.

4 Claims, 23 Drawing Sheets

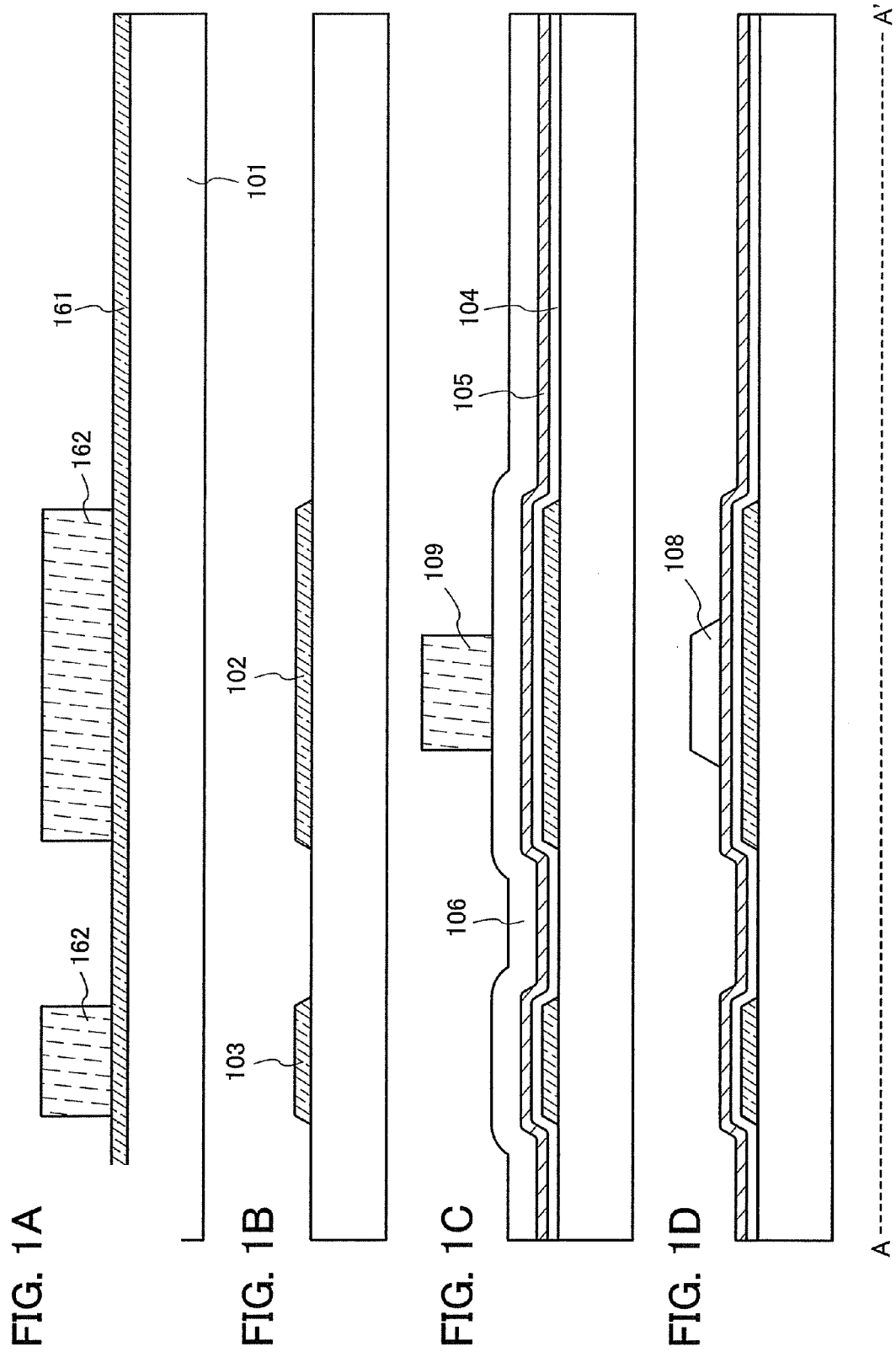

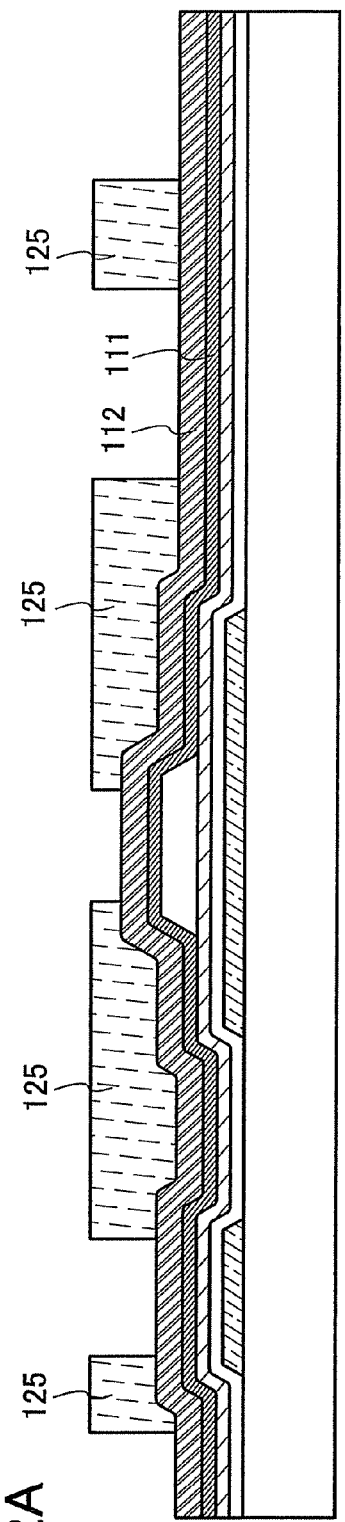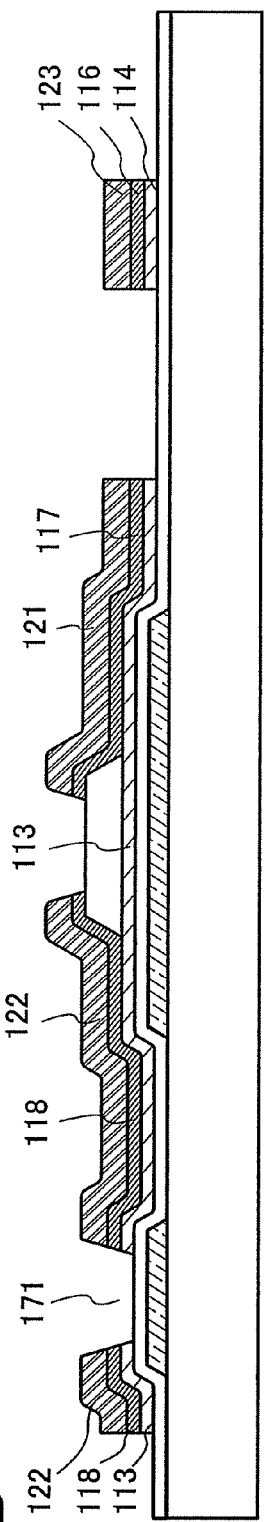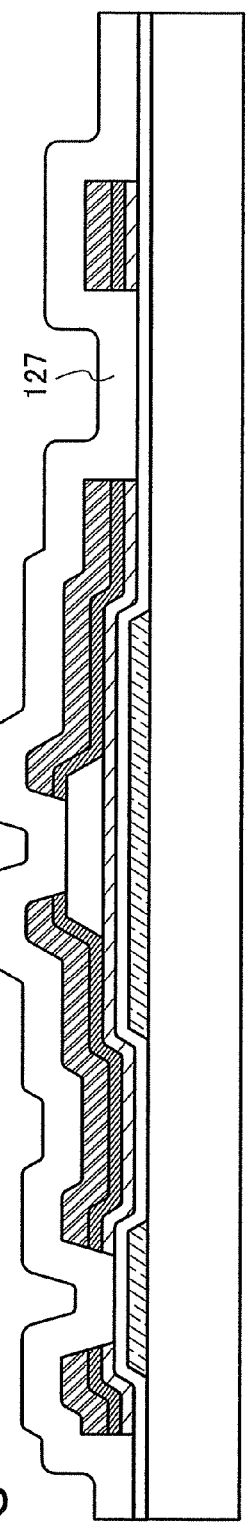

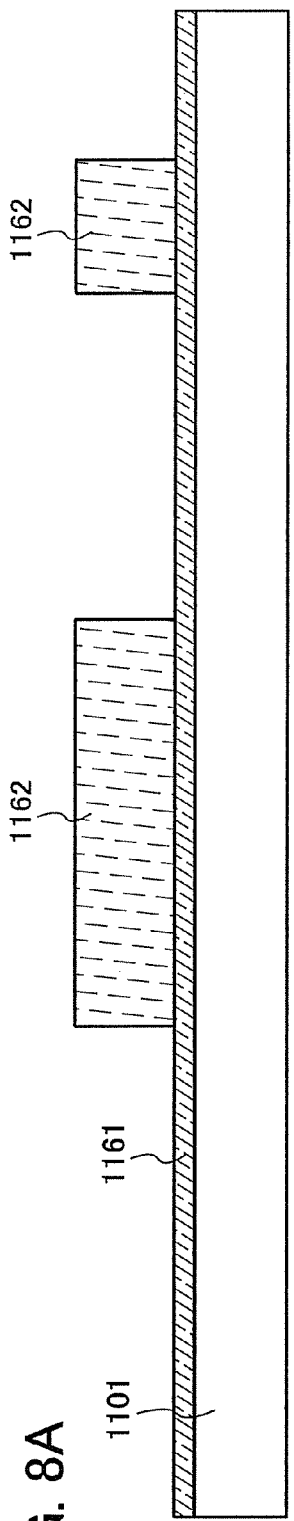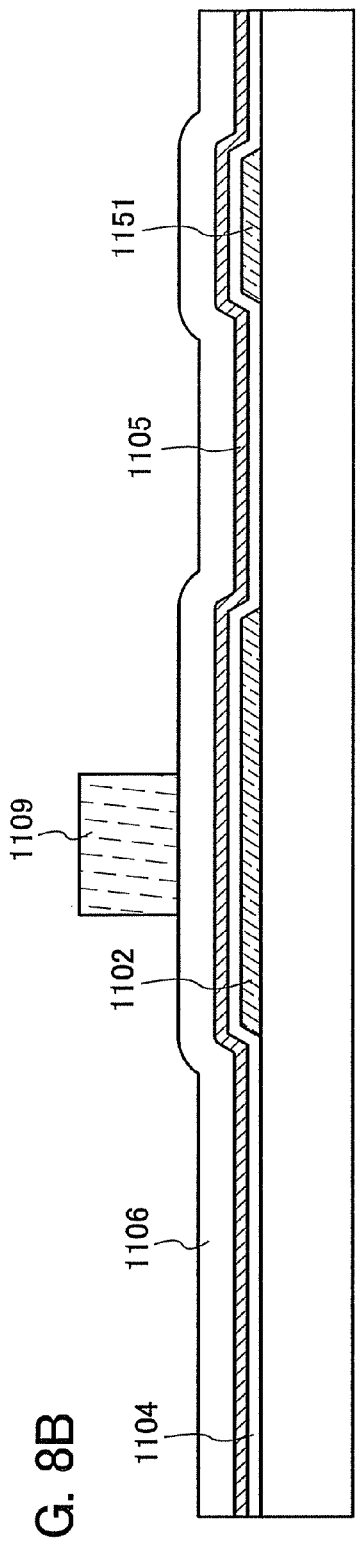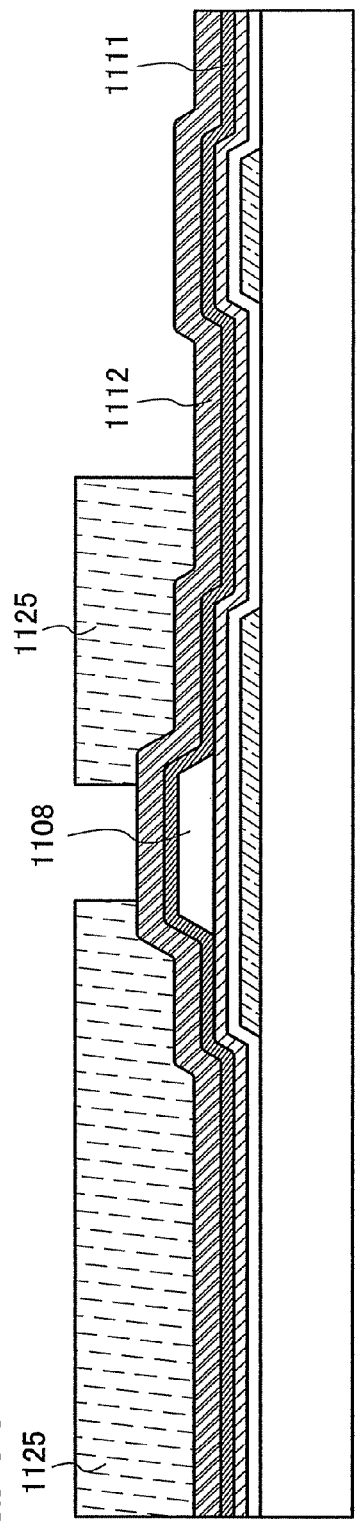

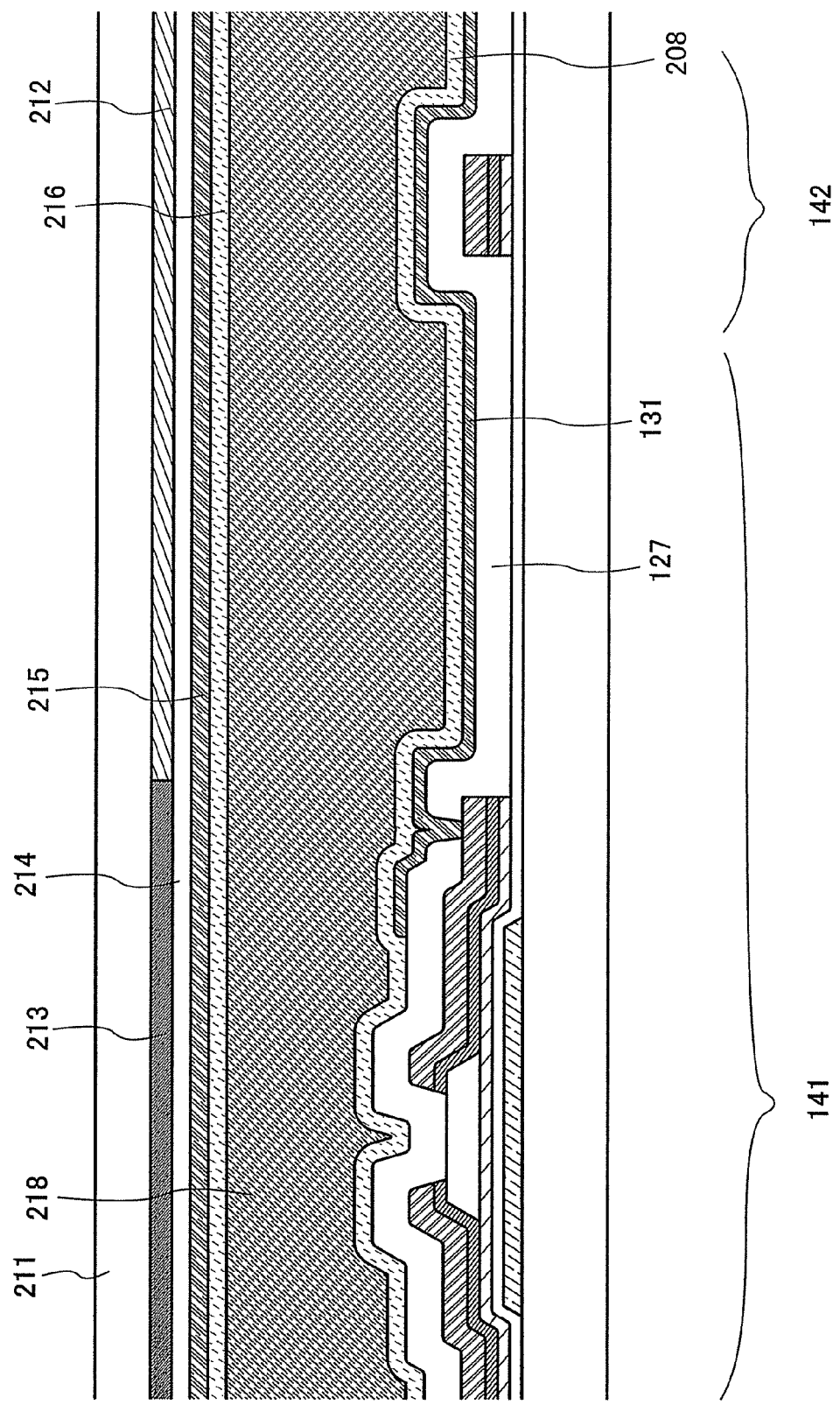

DISPLAY DEVICE AND METHOD FOR MANUFACTURING THE SAME

BACKGROUND OF THE INVENTION

1. Field of the Invention

The present invention relates to a display device and a method for manufacturing the display device.

2. Description of the Related Art

In recent years, an active matrix display device is widely used, which displays an image or character information on an electronic appliance such as a monitor of a laptop personal computer or a desktop personal computer, a cellular phone, an audio reproducing device, a television set, a mobile terminal, a digital still camera, a video camera, or a viewer for viewing an image and a moving picture.

In the active matrix display device, active elements (for example, thin film transistors: TFTs) are arranged in matrix corresponding to pixels individually in a pixel portion which is to be a display region. As a switching element, the TFT controls voltage which is applied to the pixels, whereby desired images are displayed.

On an element substrate provided with an inverted staggered TFT of channel stopper type (also called channel protective type or etching stopper type) among TFTs used as switching elements, steps up to forming a pixel electrode are conducted using five photomasks (see Reference 1: Japanese Published Patent Application No. 2002-148658).

An example of a conventional inverted staggered TFT of channel stopper type and a conventional pixel portion including the inverted staggered TFT is shown in FIG. 6, FIG. 7, FIGS. 8A to 8C, and FIGS. 9A and 9B. FIG. 6 is a top view of one pixel and the periphery thereof, and FIG. 7 is a cross-sectional view along a line B-B' of FIG. 6. FIGS. 8A to 8C and FIGS. 9A and 9B are cross-sectional views showing steps of manufacturing the pixel portion in a state of FIG. 7.

In one pixel, a TFT region 1141, a capacitor region 1142, and a wiring region 1143 are provided over a substrate 1101. In the TFT region 1141, a gate wiring 1102, a gate insulating film 1104, an i-type semiconductor layer 1113 having a channel formation region, a channel protective film 1108 formed of an insulating film, a source region 1118 and a drain region 1117 each formed of a semiconductor layer which has an impurity element imparting one conductivity type, a source wiring 1122, a drain electrode 1121, a protective film 1127, and a pixel electrode 1131 are provided.

In the capacitor region 1142, a capacitor wiring 1151, the gate insulating film 1104, the protective film 1127, and the pixel electrode 1131 are provided. Further, in the wiring region 1143, the source wiring 1122 is provided.

The capacitor region 1142 has a structure in which the capacitor wiring 1151 formed of the same material of the gate wiring 1102 through the same step thereof is a lower electrode, the pixel electrode 1131 is an upper electrode, and the gate insulating film 1104 and the protective film 1127 interposed between the upper and lower electrodes are a dielectric body.

In order to manufacture the conventional inverted staggered TFT of channel stopper type and the conventional pixel portion including the inverted staggered TFT, first, a first conductive film 1161 is formed over the substrate 1101, and resist masks 1162 are formed over the first conductive film 1161 (see FIG. 8A).

Here, the resist mask is formed through a process including the steps of application of a resist material, exposure of the resist material to light using a photomask, and development of the exposed material. In the case of exposing the applied resist material to light from an upper side, one photomask is needed for forming the resist mask. In other words, a first photomask is needed for forming the resist masks 1162.

With use of the resist masks 1162 as masks, the first conductive film 1161 is etched, so that the gate wiring 1102 and the capacitor wiring 1151 are formed. Next, the resist masks 1162 are removed, and the gate insulating film 1104, a semiconductor layer 1105, and an insulating film 1106 are formed. Then, a resist mask 1109 is formed in a region where the channel protective film 1108 is to be formed (see FIG. 8B). In other words, a second photomask is needed for forming the resist mask 1109.

Next, with use of the resist mask 1109 as a mask, the insulating film 1106 is etched, so that the channel protective film 1108 is formed. After the resist mask 1109 is removed, the semiconductor layer 1111 which has an impurity element imparting one conductivity type and a second conductive film 1112 are formed over the semiconductor layer 1105 and the channel protective film 1108. Resist masks 1125 are formed over the second conductive film 1112 (see FIG. 8C). In other words, a third photomask is used.

With use of the resist masks 1125 as masks, the second conductive film 1112 and the semiconductor layer 1111 are etched. At this time, the channel protective film 1108 and the gate insulating film 1104 function as etching stoppers. Accordingly, the second conductive film 1112 is divided, so that the source wiring 1122 and the drain electrode 1121 are formed. Further, the semiconductor layer 1111 which has an impurity element imparting one conductivity type is also divided, so that the source region 1118 and the drain region 1117 are formed. Furthermore, the semiconductor layer 1105 is also etched, and an end thereof is in alignment with ends of the drain region 1117 and the drain electrode 1121. Next, after the resist masks 1125 are removed, the protective film 1127 is formed over an entire surface, and resist masks 1128 are formed (see FIG. 9A). In other words, a fourth photomask is used.

With use of the resist masks 1128, the protective film 1127 is etched, so that a contact hole 1173 is formed. After the resist masks 1128 are removed, a third conductive film 1129 is formed, and a resist mask 1134 is formed in a region which is over the third conductive film 1129 and where the pixel electrode is to be formed (see FIG. 9B). In other words, a fifth photomask is used.

With use of the resist mask 1134 as a mask, the third conductive film 1129 is etched, so that the pixel electrode 1131 is formed. Then, by removing the resist mask 1134, the pixel portion shown in FIG. 7 is completed.

SUMMARY OF THE INVENTION

In manufacture of the conventional pixel portion, five photomasks are needed. When the number of photomasks is increased by one, a variety of steps are increased, such as a pre-bake step before exposure, a post-bake step after exposure, a resist strip step, a cleaning step after resist strip, and a drying step after cleaning, in addition to a resist material application step, an exposure step using a photomask, and a development step, whereby manufacturing time and manufacturing cost are increased.

In addition, there is a risk in that the resist material that cannot be removed enters an element and causes defects. Therefore, there is a possibility in that reliability of the element and device may be lowered.

In the structure shown in FIG. 6 and FIG. 7, a dielectric film of a storage capacitor is composed of two insulating films of the gate insulating film 1104 and the protective film 1127. As compared with the case of a dielectric film composed of one insulating film, capacitance of a storage capacitor becomes decrease in the case of a dielectric body composed of two insulating films.

The capacitance is inversely proportional to the thickness of the dielectric film and is proportional to the area thereof. Accordingly, in order to secure a target value of capacitance of the storage capacitor, it is necessary to make the capacitor region 1142 have a large area.

However, when the capacitor region 1142 has a large area, the aperture ratio of the pixel portion is decreased.

Thus, an object of the present invention is to increase capacitance by reducing the thickness of a dielectric film without increasing the number of photomasks and reducing the aperture ratio of a pixel portion.

In the present invention, in order to obtain a high aperture ratio in an inverted staggered TFT of channel stopper type, a storage capacitor is formed of a pixel electrode and a conductive film (hereinafter, referred to as a second conductive film) which is formed using the same material of source and drain electrodes through the same step. A dielectric film between the pixel electrode and the second conductive film is formed of only one protective film. Thus, a pixel portion with the high aperture ratio and a storage capacitor with large capacitance can be concurrently obtained.

A source wiring is formed of a conductive film (hereinafter, referred to as a first conductive film) which is formed using the same material of a gate wiring through the same step. At an intersection of the source wiring and the gate wiring, either the source wiring or the gate wiring is cut, and the wirings are connected with the second conductive film.

In particular, a light-transmitting conductive film that is a material of the pixel electrode is used for connecting the first conductive film and the second conductive film. In the case of connecting the first conductive film and the second conductive film, a contact hole is needed to be formed in a gate insulating film in the conventional case.

However, in the present invention, a contact hole of the gate insulating film is not needed to be formed by employing a structure described below. In other words, a contact hole (a first contact hole) is formed in a gate insulating film, a semiconductor layer and the second conductive film which are provided over the first conductive film. In addition, a contact hole (a second contact hole) that is larger than the first contact hole is formed in the protective film. The light-transmitting conductive film in contact with the second contact hole connects the second conductive film which is partly exposed in the second contact hole and the first conductive film which is exposed in the first contact hole.

When the first contact hole is formed, etching of the i-type semiconductor layer is hindered because of the channel protective film in the TFT, and thus, only the semiconductor layer positioned in the first contact hole can be selectively etched.

An aspect of the present invention is a display device which includes a thin film transistor including a gate electrode formed of a first conductive film, a gate insulating film formed of a first insulating layer over the first conductive film, a first semiconductor layer which is provided over the first insulating layer and which is overlapped with the gate electrode, a channel protective film which is formed of a second insulating layer over the first semiconductor layer and which is overlapped with the gate electrode, a second semiconductor layer which has an impurity element imparting one conductivity type and which is overlapped with the first semiconductor layer and divided into a source region and a drain region each having one end that extends over the channel protective film, and a source electrode and a drain electrode formed of a second conductive film over the second semiconductor layer to correspond to the source region and the drain region, respectively; a third insulating layer formed over the second conductive film; a pixel electrode which is formed of a third conductive film over the third insulating layer and which is electrically connected to one of the source electrode and the drain electrode through a contact hole formed in the third insulating layer; a capacitor wiring formed of a stacked body which includes the first semiconductor layer, the second semiconductor layer, and the second conductive film over the first insulating layer; and a storage capacitor which is formed in a region where the third insulating layer over the capacitor wiring and the pixel electrode are overlapped.

Another aspect of the present invention is a display device which includes a thin film transistor including a gate electrode formed of a first conductive film, a gate insulating film formed of a first insulating layer over the first conductive film, a first semiconductor layer which is provided over the first insulating layer and which is overlapped with the gate electrode, a channel protective film which is formed of a second insulating layer over the first semiconductor layer and which is overlapped with the gate electrode, a second semiconductor layer which has an impurity element imparting one conductivity type and which is overlapped with the first semiconductor layer and divided into a source region and a drain region each having one end that extends over the channel protective film, and a source electrode and a drain electrode formed of a second conductive film over the second semiconductor layer to correspond to the source region and the drain region, respectively; a third insulating layer formed over the second conductive film; a pixel electrode which is formed of a third conductive film over the third insulating layer and which is electrically connected to one of the source electrode and the drain electrode through a contact hole formed in the third insulating layer; a capacitor wiring formed of a stacked body which includes the first semiconductor layer, the second semiconductor layer, and the second conductive film over the first insulating layer; a storage capacitor formed in a region where the third insulating layer over the capacitor wiring and the pixel electrode are overlapped; and a connection region including a wiring formed of the first conductive film and the electrode which is formed of the third conductive film over the wiring and which is in contact with a top surface and a side surface of the other one of the source electrode and the drain electrode.

In the present invention, the third conductive film is a light-transmitting conductive film.

Another aspect of the present invention is a method for manufacturing a display device. A first conductive film is formed over a substrate; a first resist mask is formed over the first conductive film; the first conductive film is etched with use of the first resist mask, so that a gate wiring and a source wiring are formed; a first insulating film that is to be a gate insulating film, an i-type semiconductor layer, and a second insulating film are formed over the gate wiring and the source wiring; a second resist mask is formed over the second insulating film; the second insulating film is etched with use of the second resist mask, so that a channel protective film is formed; a conductivity type semiconductor layer which has an impurity element imparting one conductivity type and a second conductive film are formed over the i-type semiconductor layer and the channel protective film; a third resist mask is formed over the second conductive film; and the second conductive film, the conductivity type semiconductor layer, and the i-type semiconductor layer are etched with use of the third resist mask. Accordingly, the channel protective film is exposed; a source electrode, a drain electrode, and a capacitor wiring are formed by the etching of the second conductive film; a source region, a drain region, and a conductivity type semiconductor layer of the capacitor wiring are formed by the etching of the conductivity type semiconductor layer; an i-type semiconductor layer including a channel formation region and an i-type semiconductor layer of the capacitor wiring are formed by the etching of the i-type semiconductor layer; and a first contact hole is formed over the source wiring and the gate insulating film by the etching of the second conductive film, the conductivity type semiconductor layer, and the i-type semiconductor layer. After that, a protective film is formed to cover the source electrode, the drain electrode, the channel protective film, and the wiring of the capacitor wiring; a fourth resist mask is formed over the protective film; and the protective film and the gate insulating film are etched with use of the fourth resist mask. Accordingly, a second contact hole is formed with a larger diameter than the first contact hole by etching of the protective film; the gate insulating film in the first contact hole is removed and the source wiring is exposed by the etching of the gate insulating film; a stepwise-shaped contact hole is formed in the protective film, the source electrode, the source region, the i-type semiconductor layer, and the gate insulating film by the first contact hole and the second contact hole where the gate insulating film is removed; and a third contact hole reaching the drain electrode is formed in the protective film by the etching of the protective film. After that, a third conductive film is formed to cover the protective film, the stepwise-shaped contact hole, and the third contact hole; a fifth resist mask is formed over the third conductive film; and the third conductive film is etched with use of the fifth resist mask, so that a pixel electrode which is electrically connected to the drain electrode through the third contact hole and extends over the capacitor wiring is formed, and an electrode which electrically connects the source wiring and the source electrode in the stepwise-shaped contact hole is formed by the etching of the third conductive film.

In the present invention, the third conductive film is a light-transmitting conductive film.

Note that, a semiconductor device refers to an element of a thin film transistor which functions by utilizing semiconductor characteristics or the like and a device having such an element in general. For example, a liquid crystal display device using a thin film transistor and an electronic appliance using a thin film transistor are included in the category of the semiconductor device.

In accordance with the present invention, it becomes possible to obtain a pixel portion with high capacitance of a storage capacitor and the high aperture ratio without increasing the number of photomasks. Therefore, it becomes possible to obtain a display device with high reliability and an electronic appliance having such a display device with reduced manufacturing cost and manufacturing time.

BRIEF DESCRIPTION OF THE DRAWINGS

FIGS. 1A to 1D are cross-sectional views illustrating a manufacturing step of a pixel portion of the present invention.

FIGS. 2A to 2C are cross-sectional views illustrating a manufacturing step of a pixel portion of the present invention.

FIGS. 8A to 8C are cross-sectional views illustrating a manufacturing step of a conventional pixel portion.

FIG. 10 is a cross-sectional view illustrating a manufacturing step of a liquid crystal display device of the present invention.

DETAILED DESCRIPTION OF THE INVENTION

Hereinafter, embodiment modes of the present invention will be described with reference to the drawings. However, it is easily understood by those skilled in the art that the present invention can be implemented in various different modes, and modes and details of the present invention can be modified in various ways without departing from the purpose and the scope of the present invention. Therefore, the present invention is not to be construed with limitation to what is described in the embodiment modes.

Through the drawings of the embodiment modes, like components are denoted by like numerals and will not be further explained.

EMBODIMENT MODE 1

This embodiment mode will describe a method for manufacturing an inverted staggered TFT of channel stopper type of the present invention and a pixel portion including the inverted staggered TFT, with reference to FIGS. 1A to 1D, FIGS. 2A to 2C, FIGS. 3A to 3C, FIG. 4, FIG. 5, FIG. 20, FIG. 21, FIG. 22, and FIG. 23.

Figure 3A:
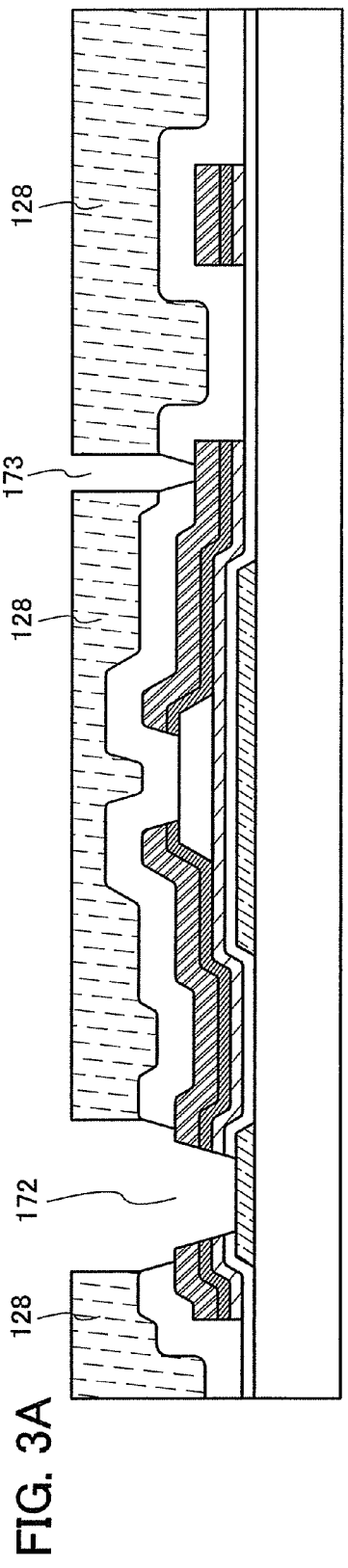
FIGS. 3A to 3C are cross-sectional views illustrating a manufacturing step of a pixel portion of the present invention.
Figure 3B:
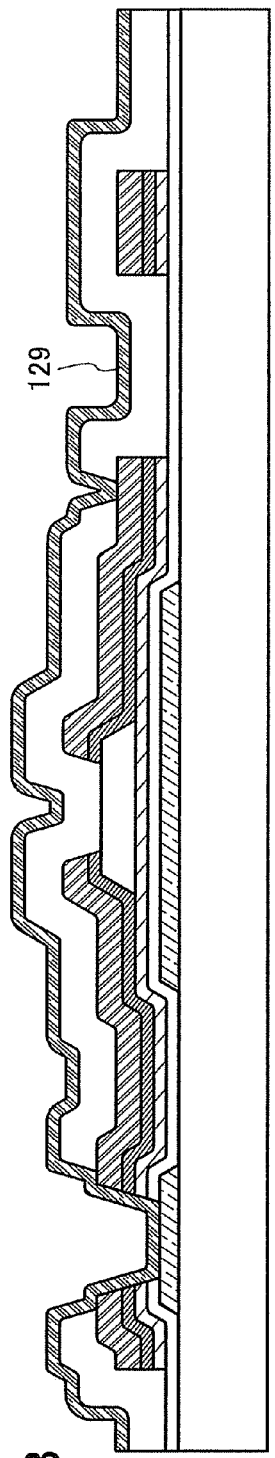
Figure 3C:
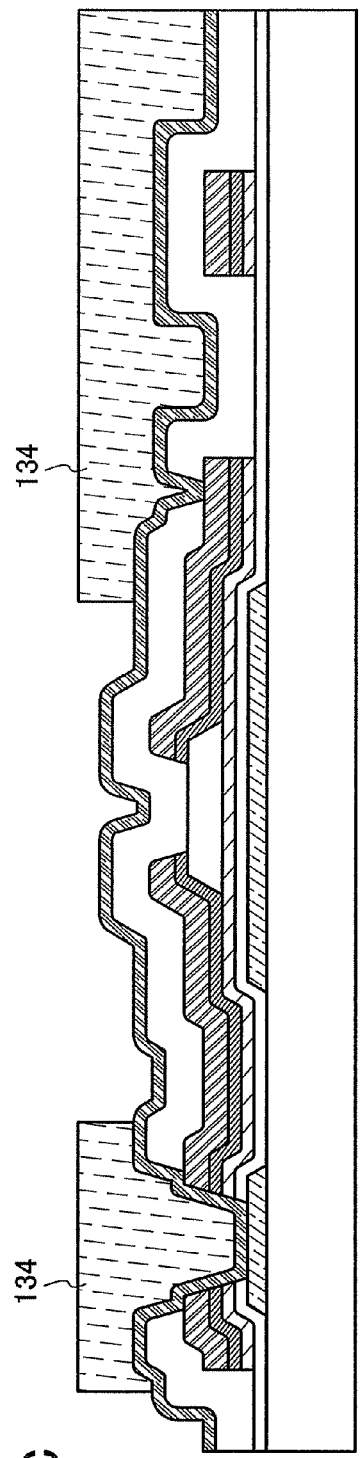
Figure 4:
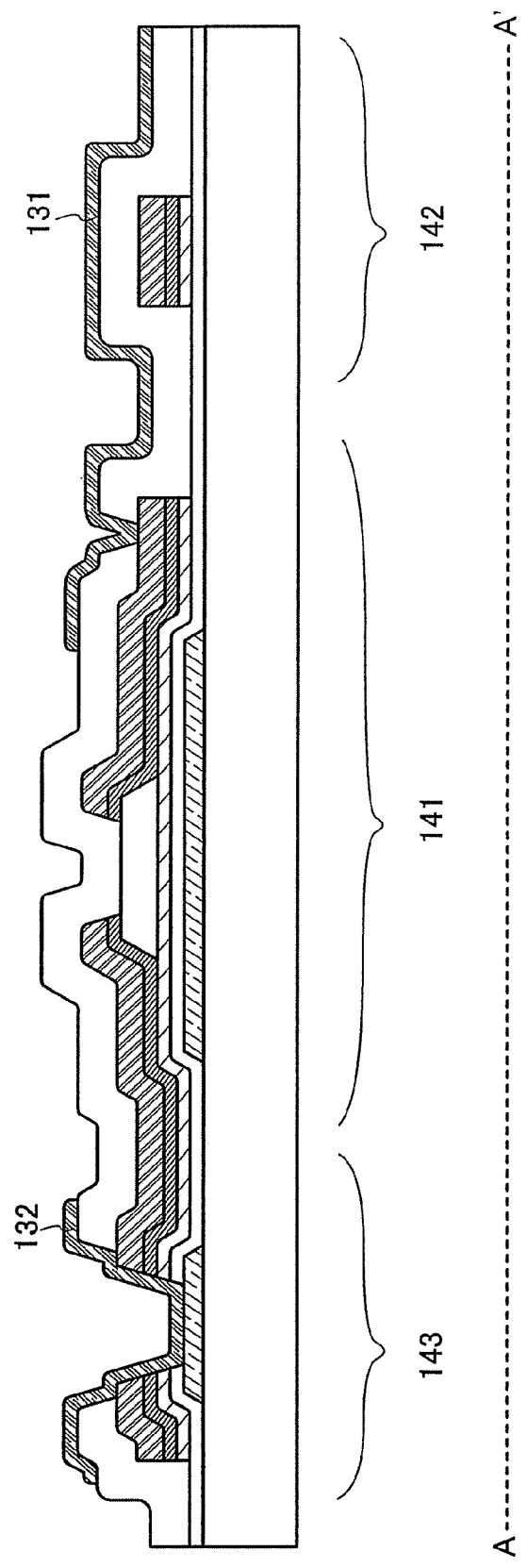
FIG. 4 is a cross-sectional view illustrating a manufacturing step of a pixel portion of the present invention.
Figure 5:
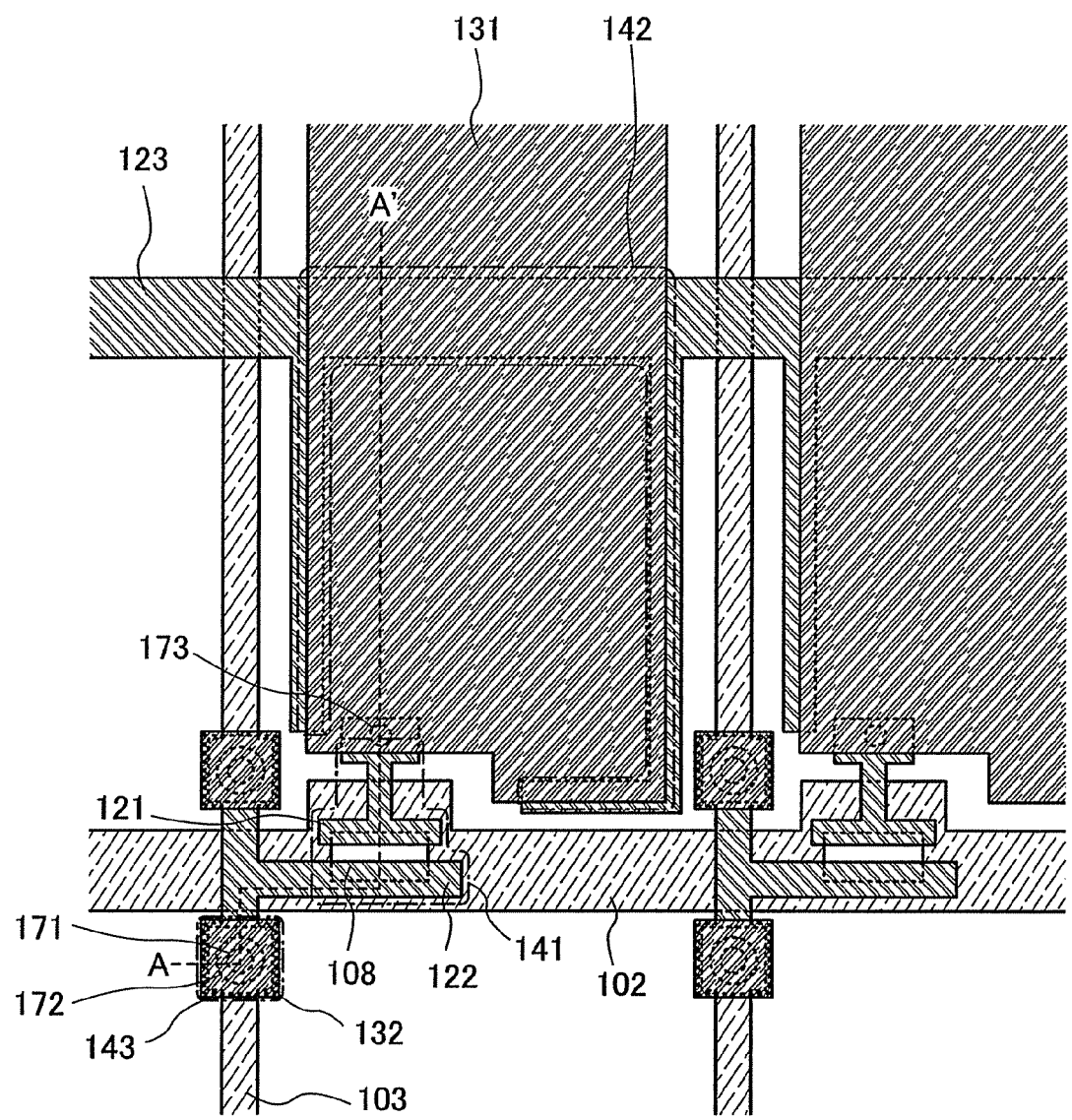
FIG. 5 is a top view of a pixel portion of the present invention.
Figure 6:
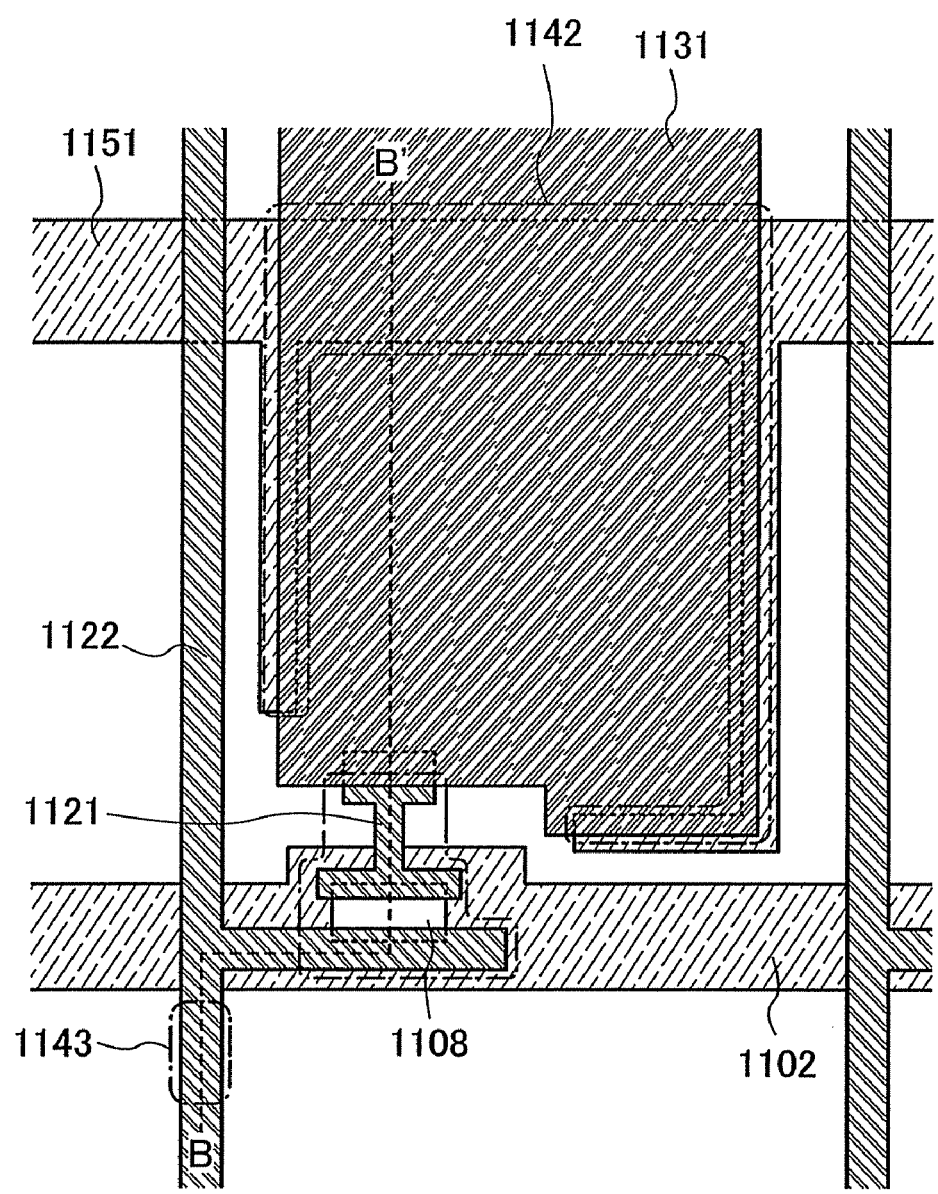
FIG. 6 is a top view of a conventional pixel portion.
Figure 7:
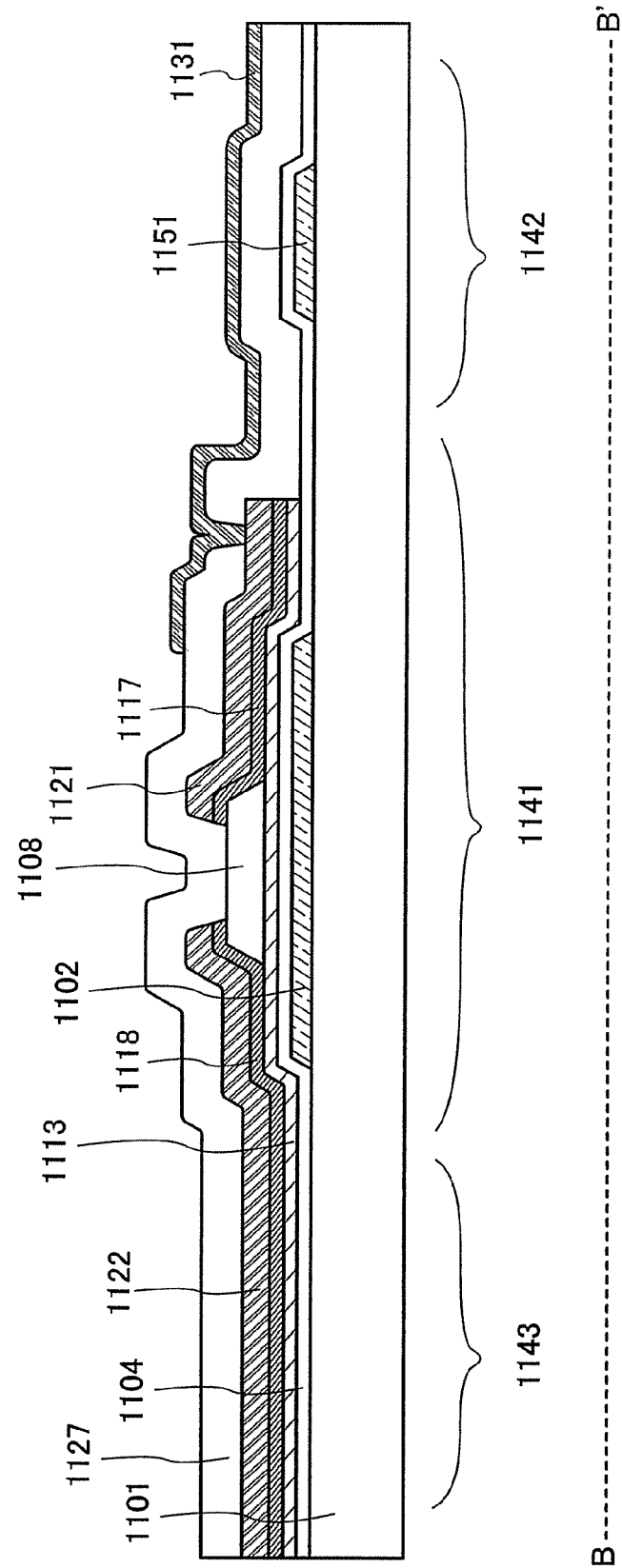
FIG. 7 is a cross-sectional view illustrating a manufacturing step of a conventional pixel portion.
Figure 9A:
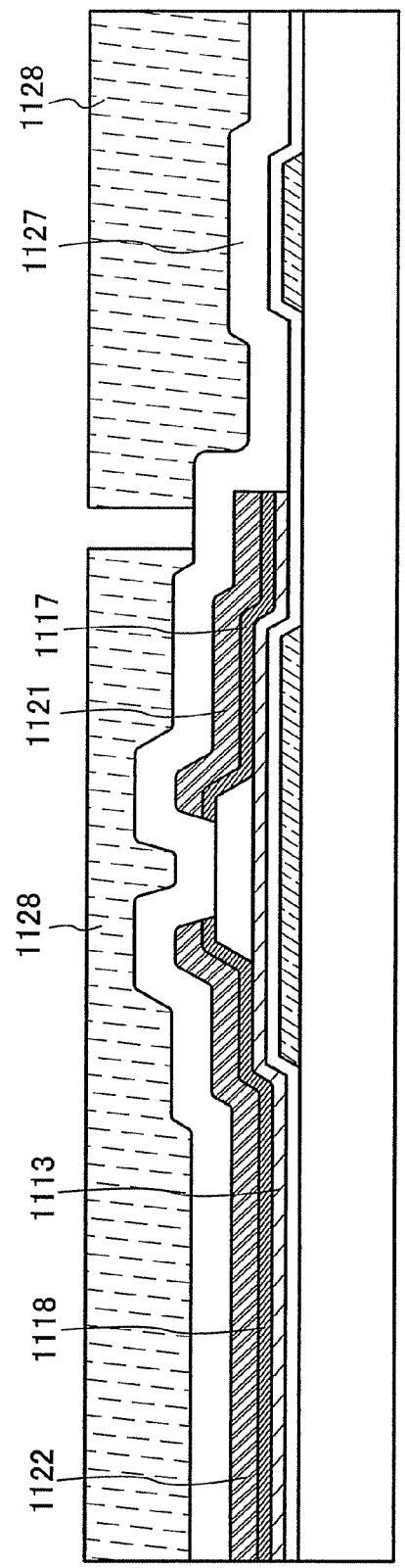
FIGS. 9A and 9B are cross-sectional views illustrating a manufacturing step of a conventional pixel portion.
Figure 9B:
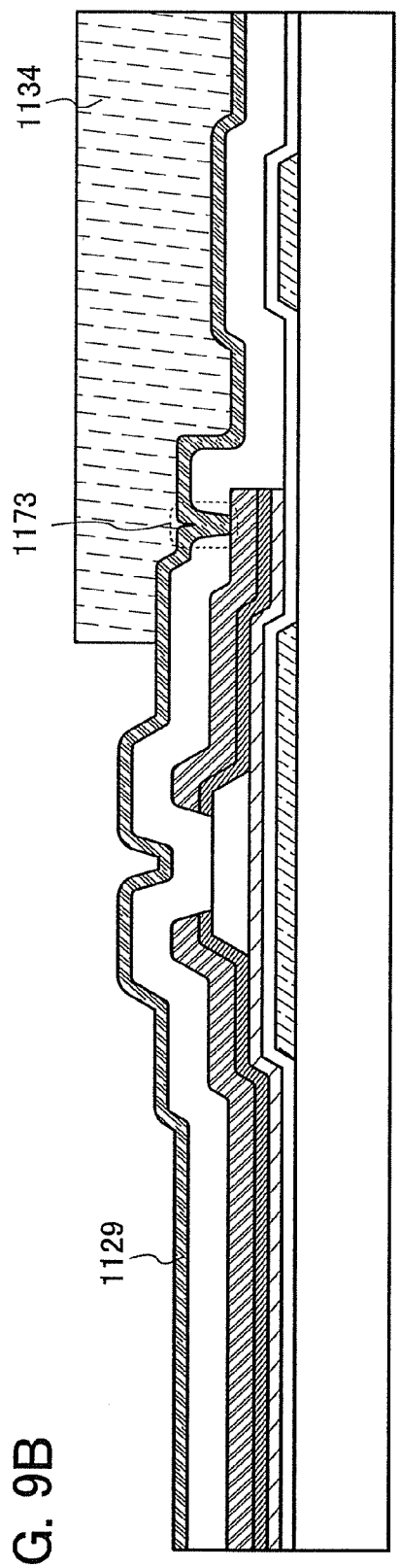

FIG. 5 shows a top view of a pixel portion manufactured in this embodiment mode, and FIG. 4 shows a cross-sectional view taken along a line A-A' in FIG. 5. In FIG. 4 and FIG. 5, a TFT region 141, a capacitor region 142, and a connection region 143 are formed over a substrate 101. Manufacturing steps up to a state of FIG. 4 are described below with reference to FIGS. 1A to 1D, FIGS. 2A to 2C, FIGS. 3A to 3C, FIG. 20, FIG. 21, FIG. 22, and FIG. 23.

First, a first conductive film 161 is formed over the substrate 101, and resist masks 162 for forming a gate wiring 102 and a source wiring 103 are formed (see FIG. 1A).

In order to form the resist masks 162 as described above, one photomask is needed. The photomask for forming the resist masks 162 is a first photomask.

As the substrate 101, a light-transmitting insulating substrate is used. For example, a light-transmitting glass substrate such as a barium borosilicate glass substrate, an aluminoborosilicate glass substrate, or an alumino silicate glass substrate, typified by #7059, #1737, EAGLE 2000, or the like manufactured by Corning Incorporated can be used. A light-transmitting quartz substrate or the like may also be used.

Although it is preferable that the first conductive film 161 be formed of a low resistant conductive material such as aluminum (Al), there is a problem in that the conductive film 161 has less heat resistance and is easily eroded when aluminum is used by itself. Therefore, it is preferable to form a stacked film in combination with a heat-resistant conductive material.

As the heat-resistant conductive material, an element selected from molybdenum (Mo), titanium (Ti), tantalum (Ta), tungsten (W), or chromium (Cr), an alloy film containing the aforementioned element as its component, or nitride containing the aforementioned element as its component may be used. Alternatively, combination of only such heat-resistant materials may be used.

As aluminum, aluminum containing 0.01 to 5 atom % of scandium (Sc), titanium (Ti), silicon (Si), copper (Cu), chromium (Cr), neodymium (Nd), molybdenum (Mo), or the like may be used in addition to pure aluminum. By adding an atom with mass larger than aluminum, effects of limiting transfer of an aluminum atom during heat treatment and preventing generation of a hillock are obtained.

As an example of combination of the above aluminum and heat-resistant conductive material, the following can be used: a stacked film of a film containing chromium (Cr) and a film containing aluminum (Al); a stacked film of a film containing chromium (Cr) and a film containing aluminum containing neodymium (Al—Nd); a stacked film of a film containing titanium (Ti), a film containing aluminum (Al), and a film containing titanium (Ti); a stacked film of a film containing titanium (Ti), a film containing aluminum containing neodymium (Al—Nd), and a film containing titanium (Ti); a stacked film of a film containing molybdenum (Mo), a film containing aluminum (Al), and a film containing molybdenum (Mo); a stacked film of a film containing molybdenum (Mo), a film containing aluminum containing neodymium (Al—Nd), and a film containing molybdenum (Mo); a stacked film of a film containing molybdenum (Mo) and a film containing aluminum (Al); a stacked film of a film containing molybdenum (Mo) and a film containing aluminum containing neodymium (Al—Nd); or the like.

Next, with use of the resist masks 162 as masks, the first conductive film 161 is etched, so that the gate wiring 102 and the source wiring 103 are formed, and then, the resist masks 162 are removed (see FIG. 1B).

Figure 21:
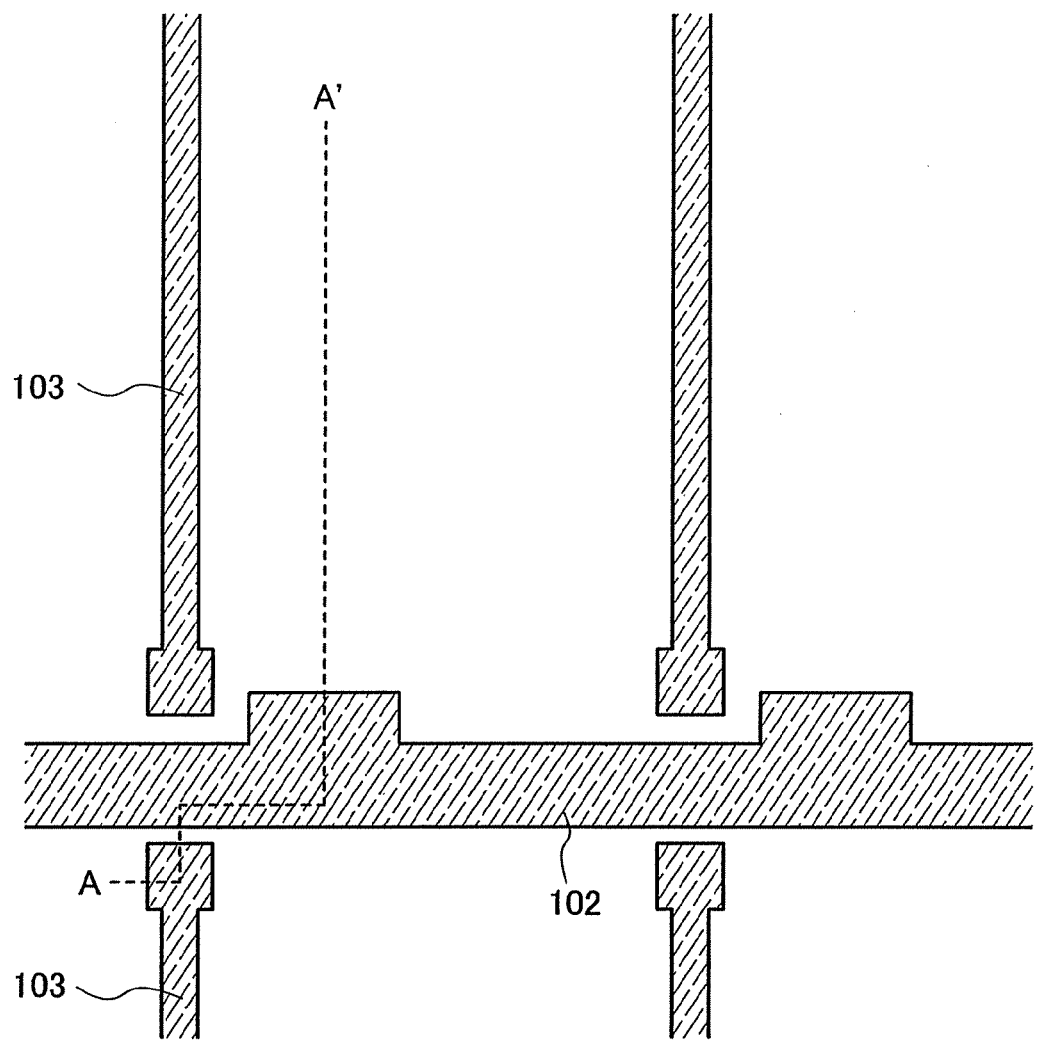
FIG. 21 is a top view illustrating a manufacturing step of a pixel portion of the present invention.

FIG. 1B shows a cross section taken along a line A-A' in FIG. 21 that is a top view.

Then, over the substrate 101, the gate wiring 102, and the source wiring 103, a gate insulating film 104 that is a first insulating film, an i-type semiconductor layer 105, and a second insulating film 106 are formed successively by a CVD method while keeping a vacuum state so as not to be exposed to air.

Here, the i-type semiconductor layer is also called an intrinsic semiconductor layer and indicates a semiconductor layer in which an impurity element imparting one conductivity type (an impurity imparting p-type or n-type conductivity) included has concentration of $1 \times 10^{20}$ cm$^{-3}$ or less, oxygen and nitrogen have concentration of $9 \times 10^{19}$ cm$^{-3}$ or less, and photoconductivity exceeds dark conductivity by 100 times or more. This intrinsic semiconductor may include an impurity element belonging to Group 13 or Group 15 of the periodic table. Since a microcrystal semiconductor layer has weak n-type conductivity when an impurity element for controlling valence electrons is not added intentionally, an impurity element imparting p-type conductivity may be added to an i-type microcrystal semiconductor layer intentionally or unintentionally at the same time of film formation or after the film formation.

Although an non-doped amorphous silicon film is used as the i-type semiconductor layer 105 in this embodiment mode, the semiconductor layer is not limited to a silicon film, and a germanium film, a silicon germanium film, or the like may be used.

Each of the gate insulating film 104 and the second insulating film 106 may be formed using any one of a silicon oxide film, a silicon nitride film, a silicon nitride film containing oxygen, and an oxide film containing nitrogen or a stacked film including two or more films aforementioned above. In this embodiment mode, a silicon nitride film is formed as the gate insulating film 104 and the second insulating film 106.

Next, a resist mask 109 is formed over the second insulating film 106 (see FIG. 1C), etching is performed with use of the resist mask 109 as a mask, so that a channel protective film 108 is formed (see FIG. 1D). Further, at this etching, the i-type semiconductor layer 105 is etched using a half tone mask or reflow, so that an island-shaped semiconductor layer may be formed.

Figure 22:
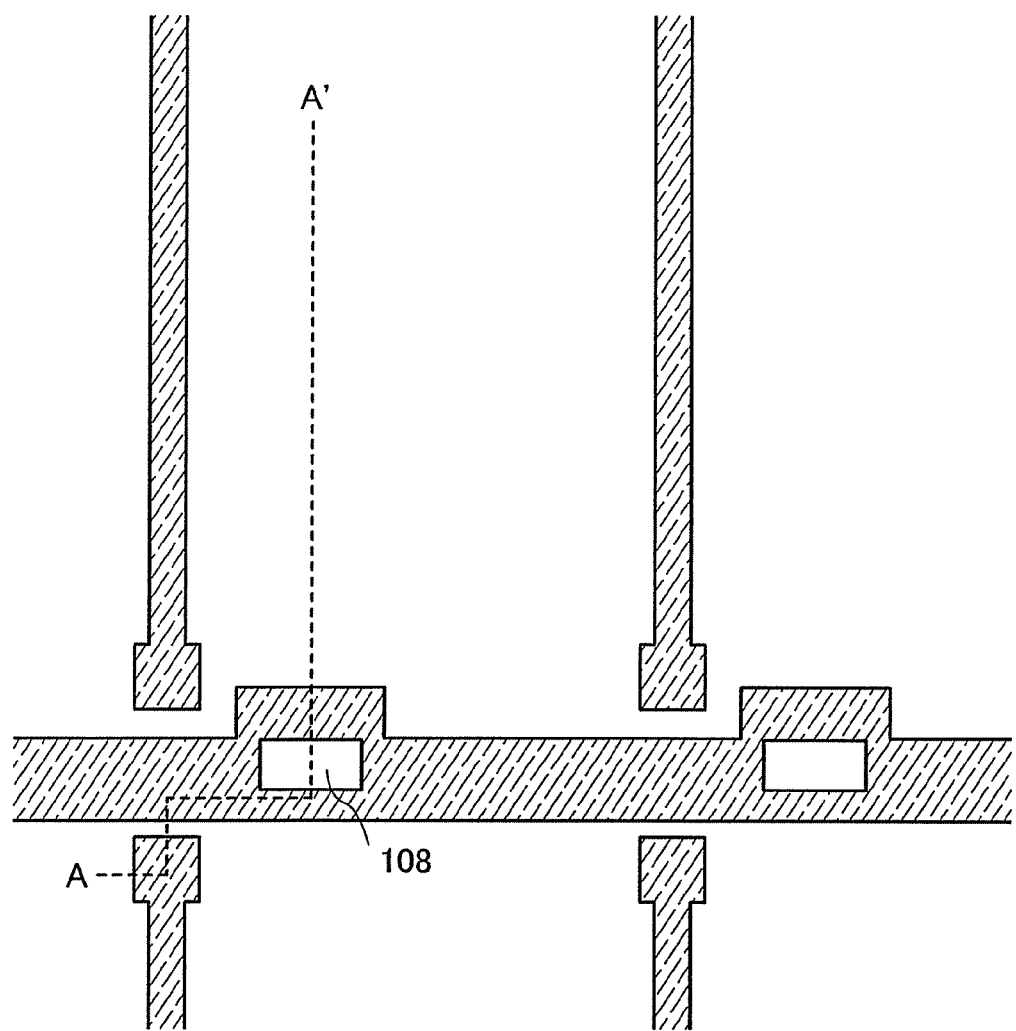
FIG. 22 is a top view illustrating a manufacturing step of a pixel portion of the present invention.

FIG. 1D is a cross section taken along a line A-A' in FIG. 22 that is a top view.

In order to form the resist mask 109, a second photomask is used.

Further, depending on an etching method, with use of the channel protective film 108 or the resist mask 109 as a mask, the i-type semiconductor layer 105 is etched, so that an island-shaped semiconductor layer which has a gentler taper shape than the channel protective film 108 formed of the second insulating film 106 can be formed.

However, in the case of forming the island-shaped semiconductor layer formed from the i-type semiconductor layer 105, the island-shaped semiconductor layer needs to have a top surface that is capable of being connected to a semiconductor layer (hereinafter, referred to as a conductivity type semiconductor layer) which has an impurity element imparting one conductivity type, which is formed over the island-shaped semiconductor layer.

A conductivity type semiconductor layer 111 and a second conductive film 112 are formed to cover the i-type semiconductor layer 105 and the channel protective film 108. An impurity element imparting one conductivity type included in the conductivity type semiconductor layer 111 may be phosphorus (P) or arsenic (As) in the case of an n-type impurity element, and may be boron (B) in the case of a p-type impurity element. In this embodiment mode, an n-channel inverted staggered TFT of channel stopper type is formed; thus, an amorphous silicon film containing phosphorus is formed as the conductivity type semiconductor layer 111. Further, the second conductive film 112 may be formed using the same material as that of the first conductive film 161.

Next, resist masks 125 are formed over the second conductive film 112, and with use of the resist masks 125 as masks, the i-type semiconductor layer 105, the conductivity type semiconductor layer 111, and the second conductive film 112 are etched (see FIG. 2A). Etching of the i-type semiconductor layer 105 and the conductivity type semiconductor layer 111 is dry etching, but etching of the second conductive film 112 may be either wet etching or dry etching. After the etching, the resist masks 125 are removed (see FIG. 2B).

In order to form the resist masks 125, a third photomask is needed.

In the TFT region 141, at a region which becomes a channel formation region in the i-type semiconductor layer 105, the channel protective film 108 functions as an etching stopper. Therefore, only the conductivity type semiconductor layer 111 and the second conductive film 112 are etched, and the i-type semiconductor layer 105 is not etched. The conductivity type semiconductor layer 111 is etched to be divided into a source region 118 and a drain region 117, and the second conductive film 112 is etched to be divided into a source electrode 122 and a drain electrode 121.

Note that in this embodiment mode, the source and the drain are distinguished for simplifying description, e.g., by provision of the source region 118 and the drain region 117, the source electrode 122 and the drain electrode 121, and the source wiring 103. However, the source and the drain may be inverted depending on the direction of current flow.

Since the channel protective film is not provided in the connection region 143, the i-type semiconductor layer 105 and the conductivity type semiconductor layer 111 are etched, and a first contact hole 171 is formed in the i-type semiconductor layer 105 and the conductivity type semiconductor layer 111.

In the capacitor region 142, a capacitor wiring which is a stacked body including a wiring 123 formed of the second conductive film, a conductivity type semiconductor layer 116, and an i-type semiconductor layer 114 is formed through this etching step.

Figure 23:
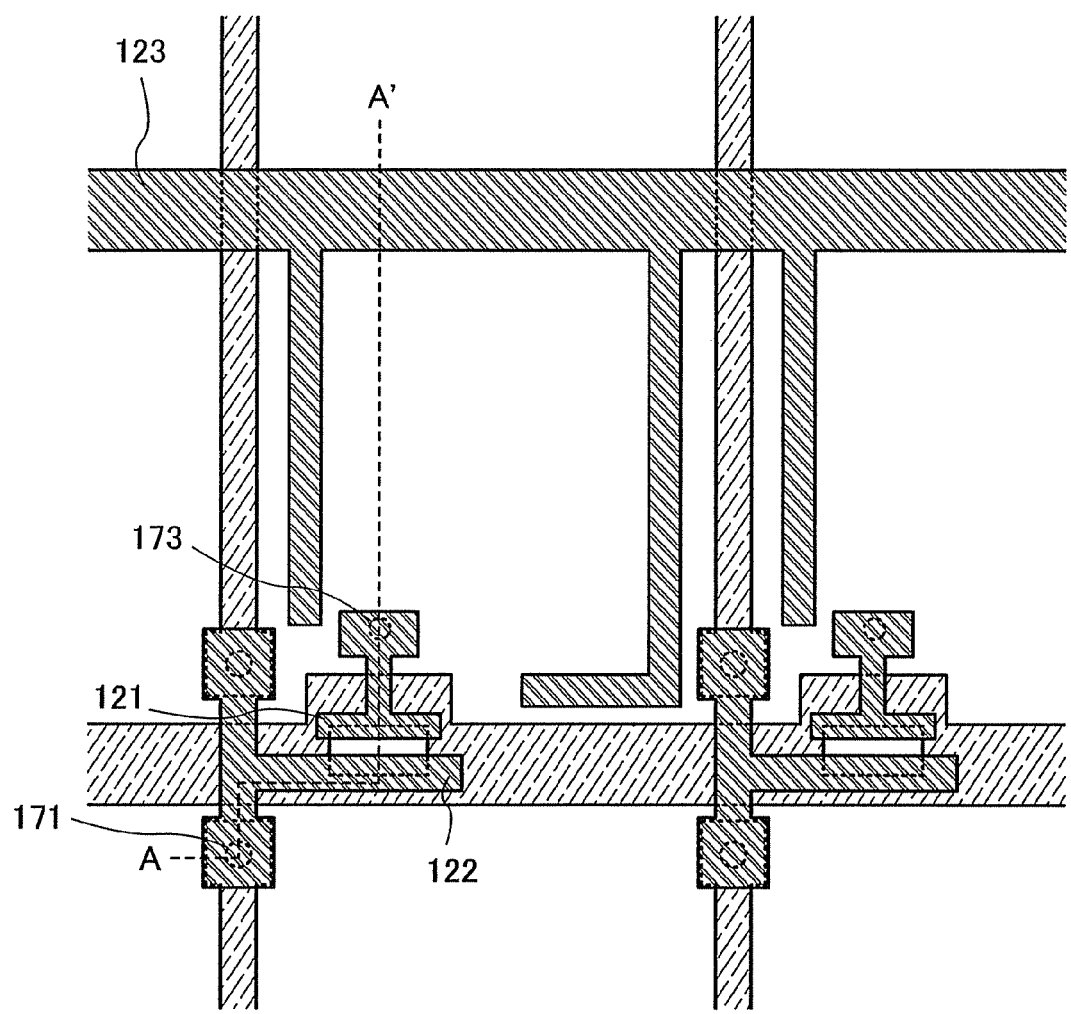
FIG. 23 is a top view illustrating a manufacturing step of a pixel portion of the present invention.

FIG. 2B shows a cross section taken along a line A-A' in FIG. 23 that is a top view.

Next, a protective film 127 formed of a third insulating film is formed over the entire surface (see FIG. 2C). The protective film 127 may be formed using the same material as that of the gate insulating film 104 and the second insulating film 106, and in this embodiment mode, a silicon nitride film is used.

After formation of the protective film 127, resist masks 128 are formed, and with use of the resist masks 128 as masks, the protective film 127 is etched. In this embodiment mode, etching of the protective film 127 is dry etching (see FIG. 3A).

In order to form the resist masks 128, a fourth photomask is used.

In the TFT region 141, a third contact hole 173 which connects a pixel electrode 131 which is to be formed later and the drain electrode 121 of the TFT is formed. In etching of the protective film 127 for forming the third contact hole 173, the drain electrode 121 formed of the second conductive film functions as an etching stopper.

On the other hand, in the connection region 143, the protective film 127 and the gate insulating film 104 are etched, so that the source wiring 103 is exposed. Further, by this etching, a second contact hole 172 is formed, which is larger than the first contact hole 171 formed by etching the i-type semiconductor layer 105 and the conductivity type semiconductor layer 111 and which entirely overlaps the first contact hole 171.

In a region where the first contact hole 171 and the second contact hole 172 are not overlapped, the source electrode 122 formed of the second conductive film is left; thus, dry etching stops at the source electrode 122, particularly, at a top surface of the source electrode 122. That is, the source electrode 122 functions as an etching stopper.

In a region where the first contact hole 171 and the second contact hole 172 are overlapped, the gate insulating film 104 below the protective film 127 is also etched, so that the source wiring 103 formed of the first conductive film is exposed.

By this etching step, a stepwise-shaped contact hole is formed in the connection region 143. As described above, in the region where the first contact hole 171 and the second contact hole 172 are not overlapped, a top surface and a side surface of the source electrode 122 are exposed. The region where the source electrode 122 is exposed becomes a region to be connected with a connection electrode 132 which is formed later using a light-transmitting conductive film; therefore, the contact hole is needed to be designed so as to have a width in consideration of contact resistance. In other words, when an exposed area is large, contact resistance is reduced. On the other hand, when the exposed area is small, contact resistance is increased. Therefore, the contact hole is needed to be designed as appropriate.

In the capacitor region 142, since the protective film 127 is to be a dielectric film which forms a capacitor, the protective film 127 is not etched so as to remain.

Next, the resist masks 128 are removed, and a light-transmitting conductive film 129 is formed (see FIG. 3B). As the light-transmitting conductive film 129, metal oxide such as indium tin oxide (ITO), indium tin oxide containing silicon oxide, indium zinc oxide (IZO), or zinc oxide, or semiconductor oxide can be used. In this embodiment mode, indium tin oxide is used as the light-transmitting conductive film 129.

Resist masks 134 are formed over the light-transmitting conductive film 129, and with use of the resist masks 134 as masks, the light-transmitting conductive film 129 is etched, so that the pixel electrode 131 and the connection electrode 132 are formed (see FIG. 3C).

In order to form the resist masks 134, a fifth photomask is needed.

In the TFT region 141, the drain electrode 121 and the pixel electrode 131 are electrically connected through the contact hole formed in the protective film 127.

The pixel electrode 131 extends to the capacitor region 142, and a storage capacitor is formed in a region where the pixel electrode 131 overlaps the wiring 123 with the protective film 127 interposed therebetween.

On the other hand, in the connection region 143, the connection electrode 132 formed of the light-transmitting conductive film 129 is formed over the described stepwise-shaped contact hole, which has a size so as to entirely cover the second contact hole 172; thus, the connection electrode 132, the source wiring 103, and the source electrode 122 are electrically connected. The connection electrode 132 and the source electrode 122 are connected at the exposed surface and the exposed side surface, so that reliable connection can be made.

Next, the resist masks 134 are removed, and then a pixel portion of this embodiment mode is completed (see FIG. 4).

With use of the five photomasks, the TFT region 141 including the inverted staggered TFT of channel stopper type, the capacitor region 142, and the connection region 143 can be completed. By arranging a plurality of these regions in matrix corresponding to pixels, an image display portion is formed. Accordingly, a substrate for manufacturing an active matrix display device using a TFT as an active element can be formed. Such a substrate is referred to as a TFT substrate in this specification for the sake of convenience.

Figure 20:
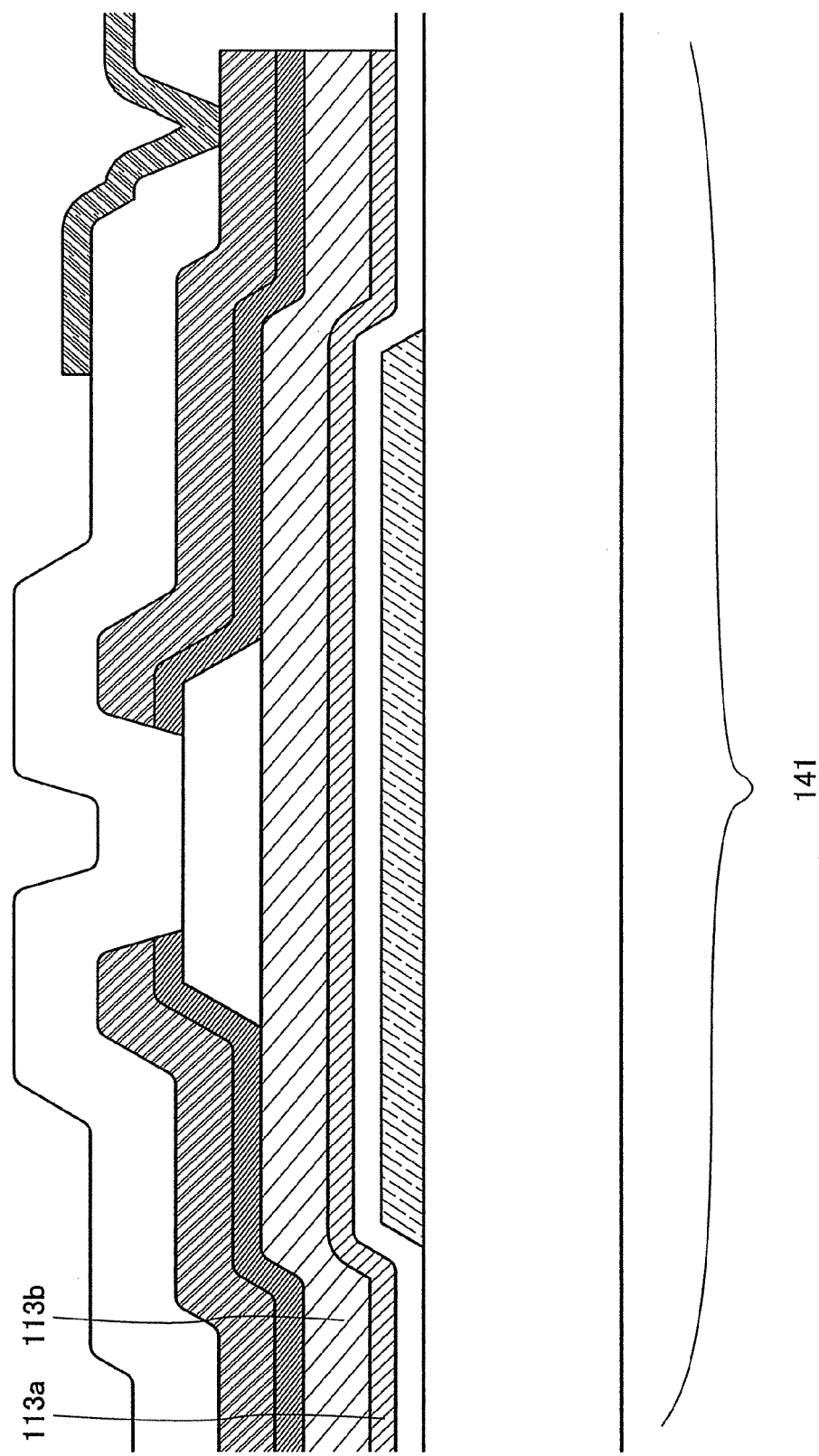
FIG. 20 is a cross-sectional view illustrating a manufacturing step of a pixel portion of the present invention.

Further, as shown in FIG. 20, an i-type semiconductor layer 113 may be a stacked film of a microcrystal semiconductor layer (also referred to as a semi-amorphous semiconductor layer) 113a and an amorphous semiconductor layer 113b.

Note that a semi-amorphous semiconductor (in this specification, also referred to as "SAS") layer is a layer containing semiconductor which has an intermediate structure between an amorphous semiconductor and a crystal (including single crystal and polycrystal) semiconductor. The semi-amorphous semiconductor layer is a semiconductor layer having a third state which is stable in free energy and include a crystalline substance with a short-range order and lattice distortion. Also, the semi-amorphous semiconductor layer can be obtained by dispersing the crystalline substance with a grain of 0.5 to 20 nm diameter in a non-single-crystal semiconductor layer. Note that a microcrystal semiconductor layer is also included in the semi-amorphous semiconductor layer.

A semi-amorphous silicon layer exemplifies the semi-amorphous semiconductor layer. The Raman spectrum of the semi-amorphous silicon layer is shifted to a wavenumber side lower than 520 cm$^{-1}$, and the diffraction peaks of (111) and (220) that are thought to be derived from a Si crystal lattice are observed in X-ray diffraction. In addition, at least 1 atomic % or more of hydrogen or halogen is contained to terminate a dangling bond. In this specification, such a silicon layer is referred to as a semi-amorphous silicon layer for the sake of convenience. Moreover, a rare gas element such as helium, argon, krypton, or neon is contained therein to further promote lattice distortion, so that stability is enhanced and a favorable semi-amorphous semiconductor layer can be obtained.

The semi-amorphous silicon layer can be obtained by glow discharge decomposition of a gas containing silicon. For a typical gas containing silicon, $SiH_4$ is given, and, in addition, $Si_2H_6$, $SiH_2Cl_2$, $SiHCl_3$, $SiCl_4$, $SiF_4$, or the like can be used. The semi-amorphous silicon layer can be easily formed with use of a gas containing silicon diluted with hydrogen or a gas in which one or more of rare gas elements selected from helium, argon, krypton, or neon is/are added to hydrogen. It is preferable that the gas containing silicon be diluted at a dilution ratio set to be in the range of 2 to 1000 times. Further, a carbide gas such as $CH_4$ or $C_2H_6$, a germanium gas such as $GeH_4$ or $GeF_4$, $F_2$, or the like may be mixed into the gas containing silicon so as to adjust the energy bandwidth to be from 1.5 to 2.4 eV or 0.9 to 1.1 eV.

In the case where a channel formation region is formed of a stacked film of the microcrystal semiconductor layer 113a and the amorphous semiconductor layer 113b, carriers flow through the microcrystal semiconductor layer 113a in ON state. As a result, there is an advantage that ON current increases and mobility of a TFT increases.

On the other hand, in OFF state, if leakage current flows through the microcrystal semiconductor layer, there is a risk that the leakage current may increase. However, in the channel formation region which is formed by stacking the microcrystal semiconductor layer 113a and the amorphous semiconductor layer 113b, leakage current flows through the amorphous semiconductor layer 113b, and thus, the leakage current can be suppressed.

The pixel portion formed by this embodiment mode and the conventional pixel portion are compared, and the comparison is described below with reference to FIG. 4 and FIG. 5, and FIG. 7 and FIG. 6.

Capacitance of the storage capacitor is proportional to an area and inversely proportional to the thickness of the dielectric film. For example, the gate insulating films 104 and 1104 and the protective films 127 and 1127 are each formed of a silicon nitride film with a thickness of 300 nm. The thickness of the dielectric film in the storage capacitor of the present invention is 300 nm which is the thickness of the protective film 127, whereas that of the conventional storage capacitor is 600 nm which is a total thickness of the gate insulating film 1104 and the protective film 1127.

Accordingly, the storage capacitor of the present invention can have capacitance twice as high as the conventional one.

Furthermore, when capacitance of the storage capacitor of the present invention and capacitance of the conventional storage capacitor are on the same level, an area of the storage capacitor of the present invention can be half as large as that of the conventional storage capacitor. Thus, an area of the wiring 123 formed of a light-shielding material can be half as large as that of the capacitor wiring 1151, and the aperture ratio of the pixel portion of the present invention can be higher than that of the conventional pixel portion.

In accordance with the above, the pixel portion including the inverted staggered TFT of channel stopper type of the present invention can be manufactured to have high capacitance of the storage capacitor and high aperture ratio without increasing the number of photomasks.

Further, in the present invention, since the thickness of the i-type semiconductor layer 105 can be reduced, it becomes possible to shorten the film formation time by a CVD method and reduce generation of leakage current in light irradiation.

Since the inverted staggered TFT of the present invention is of channel stopper type, the channel formation region in the i-type semiconductor layer 113 is not exposed to air due to the channel protective film 108.

Further, in the connection region 143, the source wiring 103, the source electrode 122, and the connection electrode 132 are electrically connected through the stepwise-shaped contact hole. On the other hand, in the conventional case where two wirings formed of different layers from each other are connected through another wiring, generally, two contact holes are needed for connection. The stepwise-shaped contact hole of the present invention may have a slightly larger size than one of two contact holes formed for connection, but its area is sufficiently smaller than the combined area of the two contact holes. Therefore, the stepwise-shaped contact hole is effective in improvement in the aperture ratio. Reduction in the number of the contact holes indicates reduction in incidence of defects.

EMBODIMENT MODE 2

This embodiment mode will describe below manufacturing steps up to complete a liquid crystal display device by using the TFT substrate manufactured in Embodiment Mode 1, with reference to FIG. 10, FIGS. 11A to 11D, and FIG. 12.

An alignment film 208 is formed so as to cover the protective film 127 and the pixel electrode 131 over the TFT substrate. The alignment film 208 may be formed by a droplet discharge method, a screen printing method, or an offset printing method. After that, rubbing treatment is performed on the surface of the alignment film 208.

Then, on a counter substrate 211, a color filter including a coloring layer 212, a light-shielding layer (black matrix) 213, and an overcoat layer 214 are provided, a counter electrode 215 formed of a light-transmitting conductive film is provided, and an alignment film 216 are formed thereon (see FIG. 10). Since the counter electrode 215 is formed using a light-transmitting conductive film, the liquid crystal display device of this embodiment mode becomes a transmissive liquid crystal display device. When the counter electrode 215 is formed of a reflective electrode, the liquid crystal display device of this embodiment mode becomes a reflective liquid crystal display device.

A sealing material 221 is formed by a dispenser so as to surround a region overlapped with a pixel portion 231. Although an example of forming the sealing material 221 so as to surround the pixel portion 231 by dropping a liquid crystal 218 is shown here, a dip method (pumping method) may be used as well, in which the sealing material is provided to surround the pixel portion 231 and have an opening, the TFT substrate is attached thereto, and then a liquid crystal is injected by utilizing capillary phenomenon (see FIG. 11A).

Figure 11A:
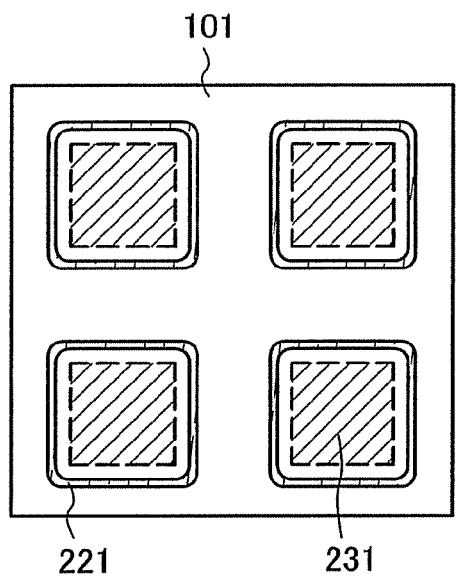
FIGS. 11A to 11D are top views illustrating manufacturing steps of a liquid crystal display device of the present invention.
Figure 11B:
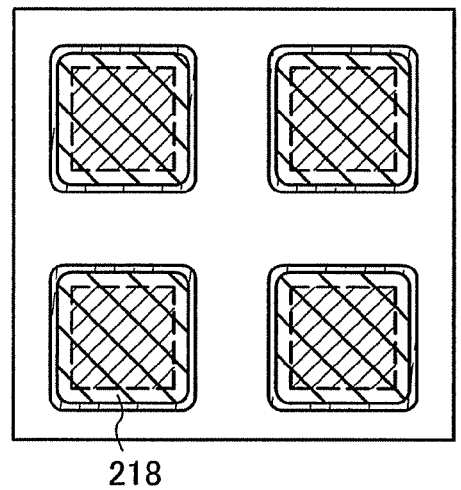
Figure 11C:
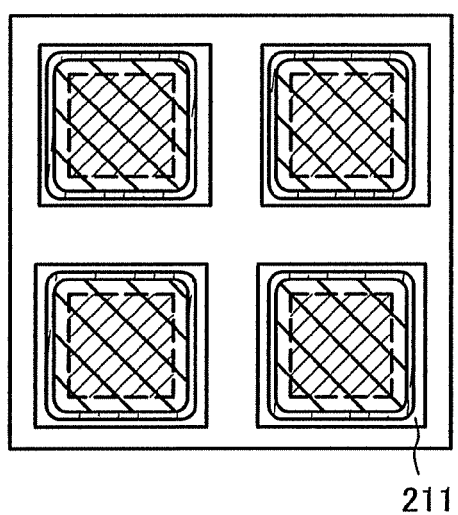
Figure 11D:
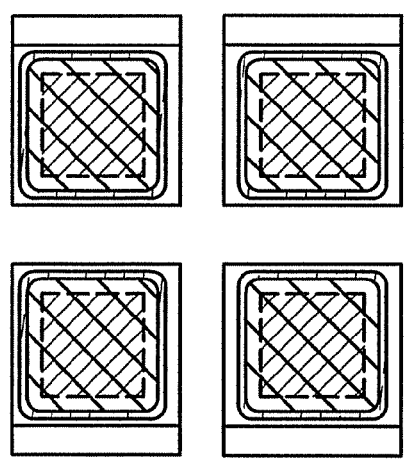

Next, the liquid crystal 218 is dropped under reduced pressure so that an air bubble does not enter (see FIG. 11B), and the substrate 101 and the counter substrate 211 are attached to each other (see FIG. 11C). The liquid crystal 218 is dropped inside the region surrounded by the sealing material 221 once or plural times.

As an alignment mode of the liquid crystal 218, a TN mode is used in which the arrangement of liquid crystal molecules is twisted at 90° from where light enters toward where light is emitted. In the case of manufacturing a liquid crystal display device of TN mode, the substrates are attached together so that the rubbing directions can be crossed each other.

The distance between a pair of the substrates may be kept by dispersing a spherical spacer or forming a columnar spacer formed of a resin, or by mixing filler in the sealing material 221. The columnar spacer has a feature that it is formed from an organic resin material containing at least one of acrylic, polyimide, polyimide amide, and epoxy as its main component, a material of any one of silicon oxide, silicon nitride, and silicon oxide containing nitrogen, or an inorganic material including a stacked film thereof.

Next, the substrate is divided. In the case of taking out many panels, the division is performed for each panel. In a case of obtaining one panel from the substrates, a division step can be skipped by attaching a counter substrate that has been cut in advance (see FIG. 11D).

Figure 12:
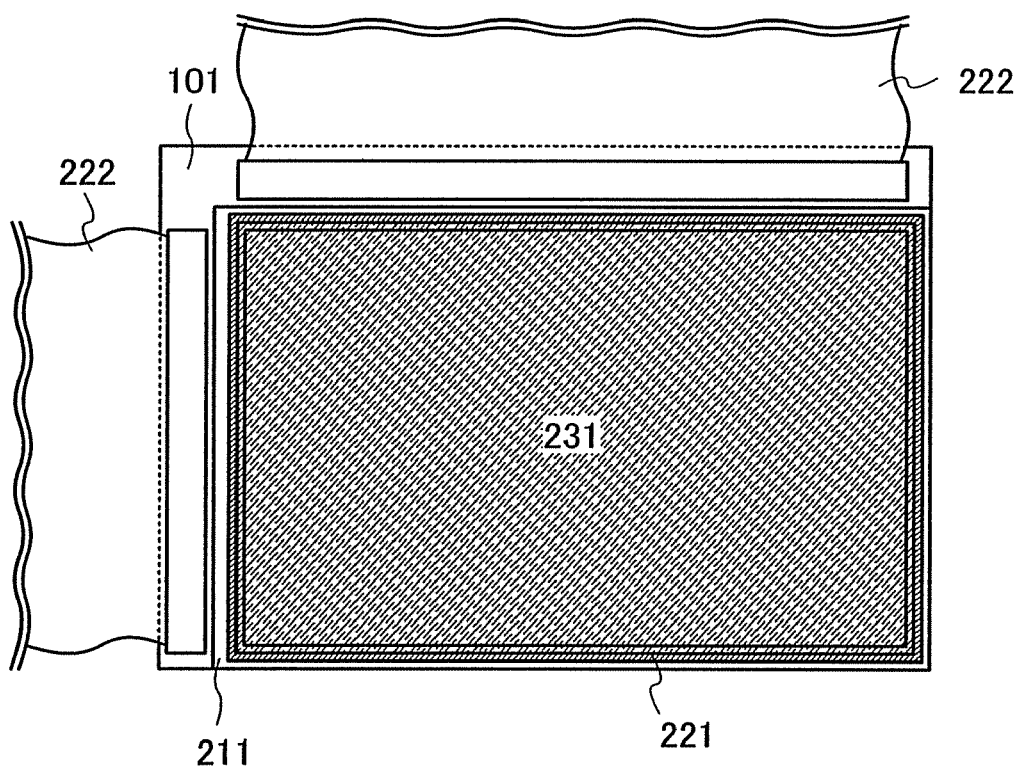
FIG. 12 is a top view illustrating a manufacturing step of a liquid crystal display device of the present invention.

Then, an FPC (Flexible Printed Circuit) 222 is pasted through an anisotropic conductive layer by a known technique (see FIG. 12). With these steps, a liquid crystal display device is completed. Further, an optical film is pasted if necessary. In the case of a transmissive liquid crystal display device, a polarizing plate is pasted on both the TFT substrate and the counter substrate. Accordingly, the liquid crystal display device of this embodiment mode can be manufactured.

EMBODIMENT MODE 3

As electronic appliances to which the present invention is applied, the following are given: a television set, a video camera, a digital camera, a goggle display, a navigation system, an audio reproducing device (such as a car audio component), a computer, a game machine, a portable information terminal (such as a mobile computer, a cellular phone, a portable game machine, and an electronic book), an image reproducing device provided with a recording medium (specifically, a device which can reproduce a recording medium such as a digital versatile disc (DVD) and includes a display capable of displaying the image), and the like.

Specific examples of those electronic appliances are shown in FIG. 13, FIG. 14, FIGS. 15A and 15B, FIGS. 16A and 16B, FIG. 17, FIGS. 18A to 18E, and FIGS. 19A and 19B.

Figure 13:
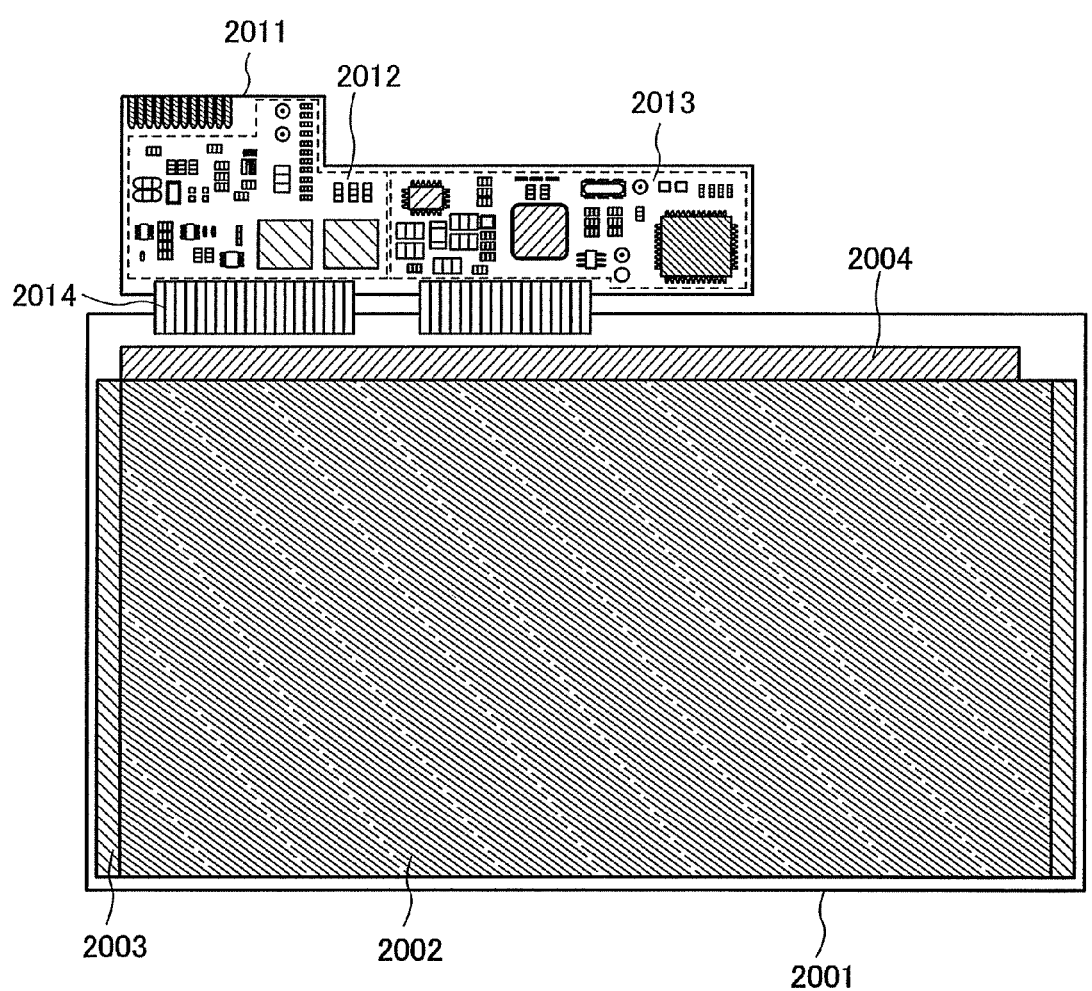
FIG. 13 illustrates an example of an electronic appliance to which the present invention is applied.

FIG. 13 shows a liquid crystal module in which a liquid crystal display panel 2001 and a circuit board 2011 are combined. In the circuit board 2011, a control circuit 2012, a signal division circuit 2013, and the like are formed, and the circuit board 2011 is electrically connected to the liquid crystal display panel 2001 formed using the present invention by a connection wiring 2014.

This liquid crystal display panel 2001 is provided with a pixel portion 2002 provided with a plurality of pixels, a scanning line driver circuit 2003, a signal line driver circuit 2004 for supplying a video signal to a selected pixel. The pixel portion 2002 may be formed based on Embodiment Mode 2, and the scanning line driver circuit 2003 and the signal line driver circuit 2004 may be formed using chips. The pixel portion 2002, and the scanning line driver circuit 2003 and the signal line driver circuit 2004 may be connected with an FPC or the like.

Figure 14:
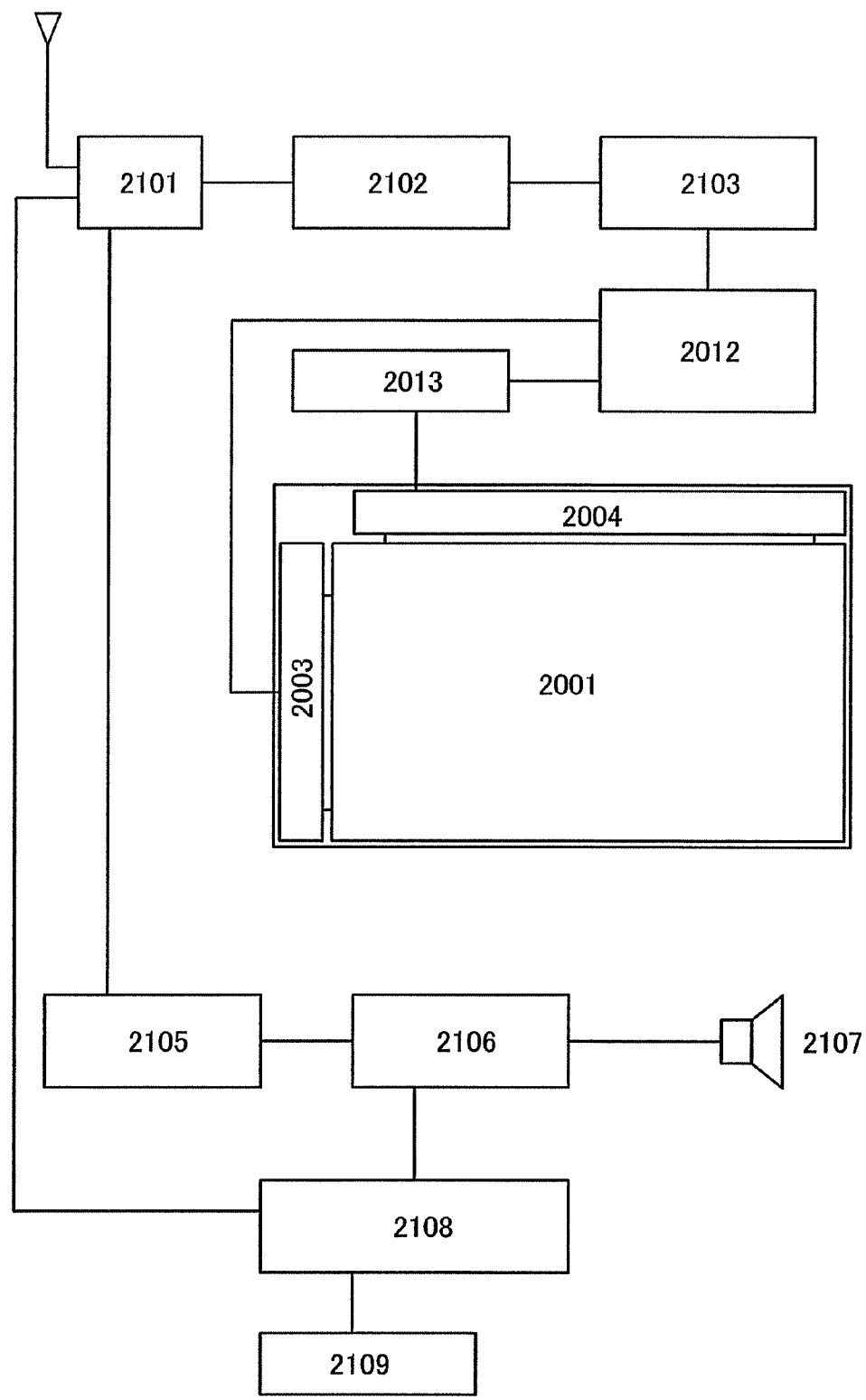
FIG. 14 is a diagram showing an example of an electronic appliance to which the present invention is applied.

A liquid crystal television receiving set can be completed with the liquid crystal module shown in FIG. 13. FIG. 14 is a block diagram showing a principle configuration of a liquid crystal television receiving set. A tuner 2101 receives an image signal and an audio signal. The image signal is processed by an image signal amplifier circuit 2102, an image signal processing circuit 2103 which converts a signal outputted from the image signal amplifier circuit 2102 into a color signal corresponding to each color of red, green, and blue, and a control circuit 2012 for converting the image signal into an input specification of a driver IC. Signals are output from the control circuit 2012 to a scanning line side and a signal line side. In a case of employing digital driving, a structure may be employed in which a signal division circuit 2013 is provided on the signal line side and an input digital signal is divided into m pieces to be supplied.

Among the signals received by the tuner 2101, the audio signal is transmitted to an audio signal amplifier circuit 2105. Then, the output of the audio signal is supplied to a speaker 2107 through an audio signal processing circuit 2106. A control circuit 2108 receives control information such as a receiving station (receiving frequency) or sound volume from an input portion 2109 and sends a signal to the tuner 2101 or the audio signal processing circuit 2106.

Figure 15A:
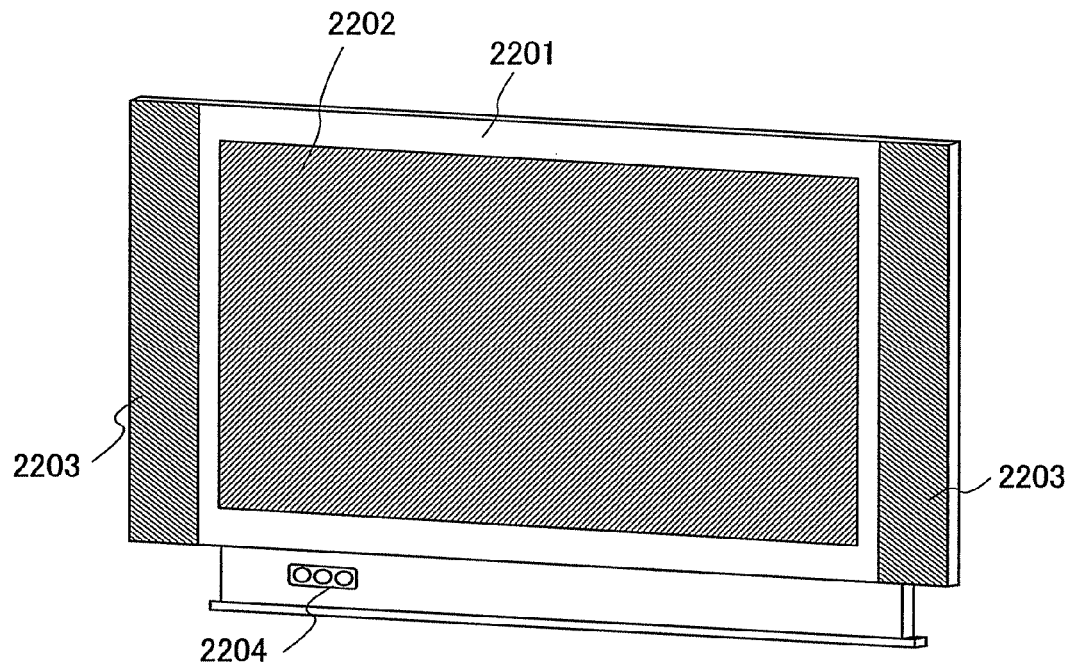
FIGS. 15A and 15B each illustrate an example of an electronic appliance to which the present invention is applied.

As shown in FIG. 15A, a television receiving set can be completed by incorporating a liquid crystal module into a housing 2201. By using the liquid crystal module, a display screen 2202 is formed. Moreover, a speaker 2203, operation switches 2204, and the like are provided appropriately.

Figure 15B:
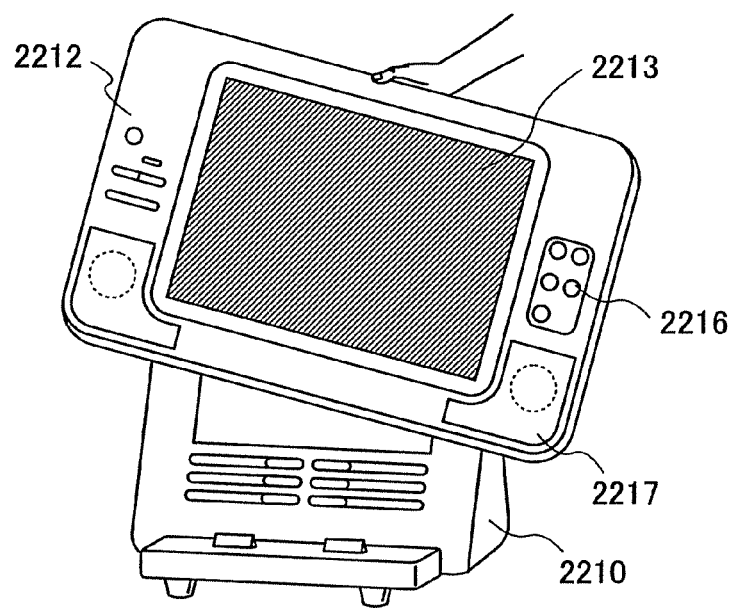

FIG. 15B shows a portable television receiving set a display, of which is portable wirelessly. A battery and a signal receiver are incorporated in a housing 2212, and a display portion 2213 and a speaker portion 2217 are driven by the battery. The battery can be repeatedly recharged by a recharger 2210. Further, the recharger 2210 can transmit and receive image signals and transmit the image signals to the signal receiver of the display. The housing 2212 is controlled by an operation key 2216. Also, the device shown in FIG. 15B can also be called an image sound two-way communication device, because it can transmit signals from the housing 2212 to the recharger 2210 by operating the operation key 2216. In addition, the device shown in FIG. 15B can also be called a general-purpose remote-control device, because communication control of another electronic appliance is possible by operating the operation key 2216, transmitting signals from the housing 2212 to the recharger 2210, and having the other electronic appliance receive signals that can be transmitted from the recharger 2210. The present invention can be applied to the display portion 2213

By applying the present invention to the television receiving set shown in FIG. 13, FIG. 14, and FIGS. 15A and 15B, a television receiving set provided with a high-quality display device can be obtained.

Of course, the present invention is not limited to the television receiving set, and can be applied to a variety of use applications, for example, a large-size display medium such as an information display board in a train station, an airport, and the like, or an advertisement display board on the street, as well as a monitor of a personal computer.

Figure 16A:
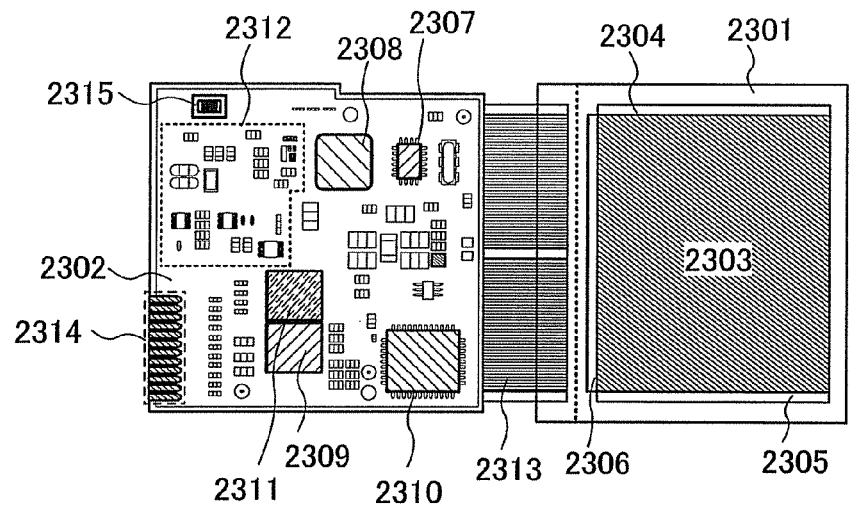
FIG. 16A illustrates an example of an electronic appliance to which the present invention is applied and FIG. 16B is a diagram thereof.

FIG. 16A shows a module in which a liquid crystal display panel 2301 that is formed using the present invention and a printed wiring board 2302 are combined. The liquid crystal display panel 2301 is provided with a pixel portion 2303 provided with a plurality of pixels, a first scanning line driver circuit 2304, a second scanning line driver circuit 2305, and a signal line driver circuit 2306 for supplying a video signal to a selected pixel.

The printed wiring board 2302 is provided with a controller 2307, a central processing unit (CPU) 2308, a memory 2309, a power supply circuit 2310, an audio processing circuit 2311, a transmitting/receiving circuit 2312, and the like. The printed wiring board 2302 and the liquid crystal display panel 2301 are connected to each other through a flexible printed circuit (FPC) 2313. The printed wiring board 2302 may employ a structure in which a capacitor element, a buffer circuit, and the like are provided and noise is prevented from occurring in power supply voltage or a signal or the rise of a signal is prevented from dulling. The controller 2307, the audio processing circuit 2311, the memory 2309, the CPU 2308, the power supply circuit 2310, and the like can be mounted to the liquid crystal display panel 2301 by using a COG (Chip on Glass) method. By means of the COG method, the size of the printed wiring board 2302 can be reduced.

Various control signals are input and output through an interface 2314 provided on the printed wiring board 2302. An antenna port 2315 for transmitting and receiving signals to/from an antenna is provided for the printed wiring board 2302.

Figure 16B:
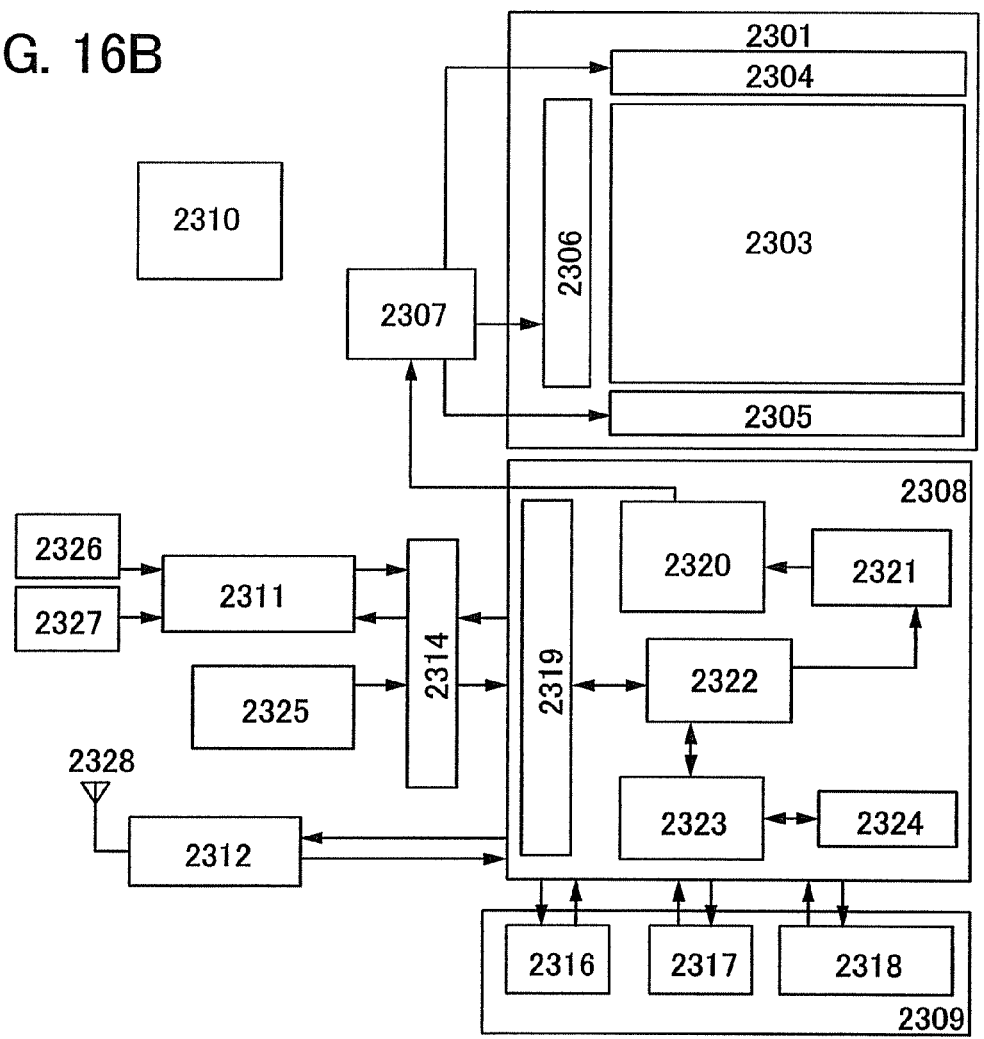

FIG. 16B is a block diagram showing the module shown in FIG. 16A. The module includes a VRAM 2316, a DRAM 2317, a flash memory 2318, and the like as the memory 2309. The VRAM 2316 stores data on an image displayed on a panel, the DRAM 2317 stores image data or audio data, and the flash memory stores various programs.

The power supply circuit 2310 supplies electric power for operating the liquid crystal display panel 2301, the controller 2307, the CPU 2308, the audio processing circuit 2311, the memory 2309, and the transmitting/receiving circuit 2312. A current source may be provided to the power supply circuit 2310 depending on a panel specification.

The CPU 2308 includes a control signal generating circuit 2320, a decoder 2321, a register 2322, an arithmetic circuit 2323, a RAM 2324, an interface 2319 for the CPU 2308, and the like. Various signals input to the CPU 2308 via the interface 2319 are once stored in the register 2322, and then input to the arithmetic circuit 2323, the decoder 2321, and the like. In the arithmetic circuit 2323, an operation is carried out based on the input signal and the location to which various instructions are transmitted is designated. On the other hand, the signal input to the decoder 2321 is decoded and input to the control signal generating circuit 2320. The control signal generating circuit 2320 produces a signal including various instructions based on the input signal, and transmits the signal to the location designated by arithmetic circuit 2323, specifically, the memory 2309, the transmitting/receiving circuit 2312, the audio processing circuit 2311, and the controller 2307, or the like.

The memory 2309, the transmitting/receiving circuit 2312, the audio processing circuit 2311, and the controller 2307 operate in accordance with the instruction received by each of them. The operation is briefly described below.

A signal input from an input means 2325 is transmitted to the CPU 2308 mounted to the printed wiring board 2302 via the interface 2314. The control signal generating circuit 2320 converts image data stored in the VRAM 2316 into a predetermined format to transmit the converted data to the controller 2307 depending on the signal transmitted from the input means 2325 such as a pointing device or a keyboard.

The controller 2307 carries out data processing for the signal including the image data transmitted from the CPU 2308 in accordance with the panel specification to supply the signal to the liquid crystal display panel 2301. Further, the controller 2307 produces a Hsync signal, a Vsync signal, a clock signal CLK, an alternating voltage (AC Cont), and a shift signal L/R based on power supply voltage input from the power supply circuit 2310 or various signals input from the CPU 2308 to supply the signals to the liquid crystal display panel 2301.

The transmitting/receiving circuit 2312 processes a signal which is to be transmitted and received by an antenna 2328 as an electric wave, specifically, the transmitting/receiving circuit 2312 includes a high-frequency circuit such as an isolator, a band pass filter, a VCO (Voltage Controlled Oscillator), an LPF (Low Pass Filter), a coupler, or a balun. A signal, among signals transmitted and received in the transmitting/receiving circuit 2312, which includes audio information is transmitted to the audio processing circuit 2311 in accordance with an instruction from the CPU 2308.

The signal including audio information which is transmitted in accordance with the instruction from the CPU 2308 is demodulated in the audio processing circuit 2311 and is transmitted to a speaker 2327. An audio signal transmitted from a microphone 2326 is modulated in the audio processing circuit 2311 and is transmitted to the transmitting/receiving circuit 2312 in accordance with an instruction from the CPU 2308.

The controller 2307, the CPU 2308, the power supply circuit 2310, the audio processing circuit 2311, and the memory 2309 can be mounted as a package of this embodiment mode. This embodiment mode may be applied to any circuit other than a high frequency circuit such as an isolator, a band path filter, a VCO (Voltage Controlled Oscillator), an LPF (Low Pass Filter), a coupler, and a balun.

Figure 17:
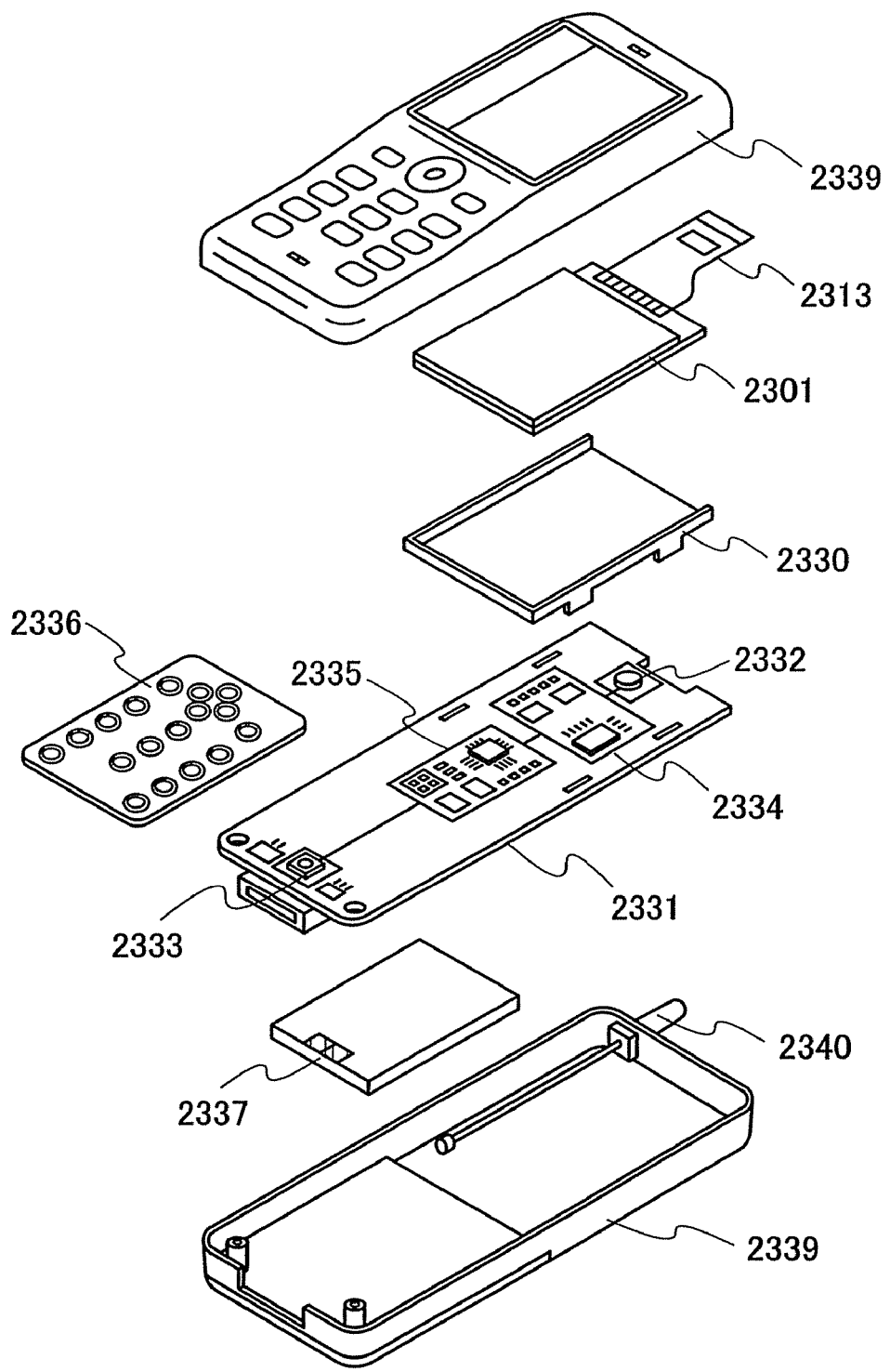
FIG. 17 illustrates an example of an electronic appliance to which the present invention is applied.

FIG. 17 shows one mode of a cellular phone including a module shown in FIGS. 16A and 16B. A liquid crystal display panel 2301 is incorporated in a housing 2330 so as to be freely attached and detached. The shape and size of the housing 2330 can be appropriately changed in accordance with the size of the liquid crystal display panel 2301. The housing 2330 provided with the liquid crystal display panel 2301 is fitted in a printed board 2331 so as to be assembled as a module.

The liquid crystal display panel 2301 is connected to the printed board 2331 through an FPC 2313. A speaker 2332, a microphone 2333, a transmitting/receiving circuit 2334, and a signal processing circuit 2335 including a CPU and a controller, and the like are formed over the printed board 2331. Such a module, an inputting means 2336, and a battery 2337 are combined, and they are stored in a housing 2339 provided with an antenna. A pixel portion of the liquid crystal display panel 2301 is disposed so as to be seen from an opening window formed in the housing 2339.

The cellular phone of this embodiment mode can be transformed into various modes depending on its functions or usages. For example, even when the cellular phone is provided with a plurality of display panels or when the housing is divided into a plurality of parts as appropriate and can be opened and closed with a hinge, the above-described operation effect can be obtained.

By implementing the present invention for the cellular phone shown in FIGS. 16A and 16B and FIG. 17, a cellular phone with a high-quality display device can be obtained.

Figure 18A:
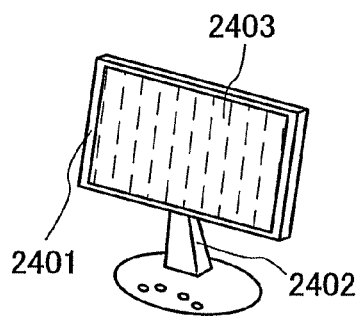
FIGS. 18A to 18E each illustrate an example of an electronic appliance to which the present invention is applied.

FIG. 18A shows a liquid crystal display, which includes a housing 2401, a supporting base 2402, a display portion 2403, and the like. The present invention can be applied to the display portion 2403.

By implementing the present invention, a liquid crystal display provided with a high-quality display device can be obtained.

Figure 18B:
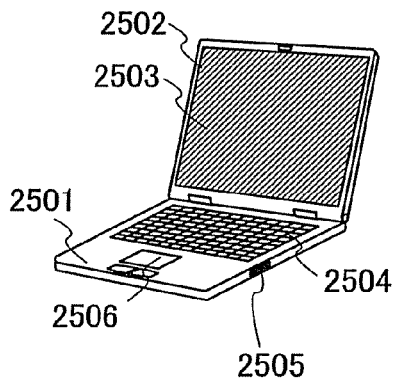

FIG. 18B shows a computer, which includes a main body 2501, a housing 2502, a display portion 2503, a key board 2504, an external connection port 2505, a pointing device 2506, and the like. The present invention can be applied to the display portion 2503.

By implementing the present invention, a computer provided with a high-quality display device can be obtained.

Figure 18C:
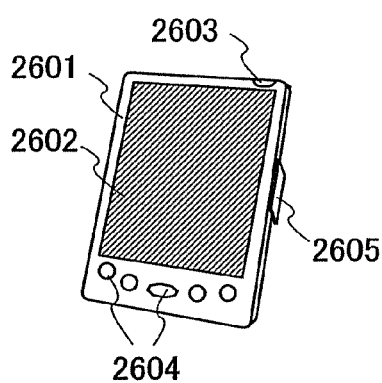

FIG. 18C shows a portable computer, which includes a main body 2601, a display portion 2602, a switch 2603, operation keys 2604, an infrared port 2605, and the like. The present invention can be applied to the display portion 2602.

By implementing the present invention, a computer provided with a high-quality display device can be obtained.

Figure 18D:
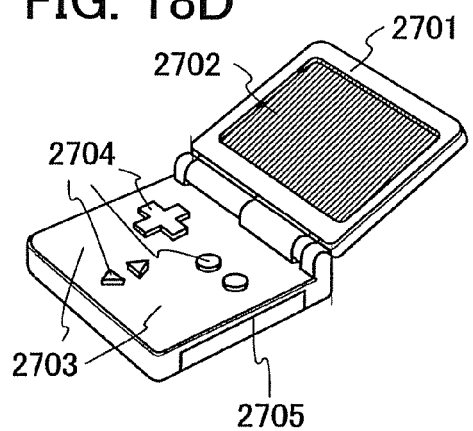

FIG. 18D shows a portable game machine, which includes a housing 2701, a display portion 2702, a speaker portion 2703, operation keys 2704, a recording medium insert portion 2705, and the like. The present invention can be applied to the display portion 2702.

By implementing the present invention, a game machine provided with a high-quality display device can be obtained.

Figure 18E:
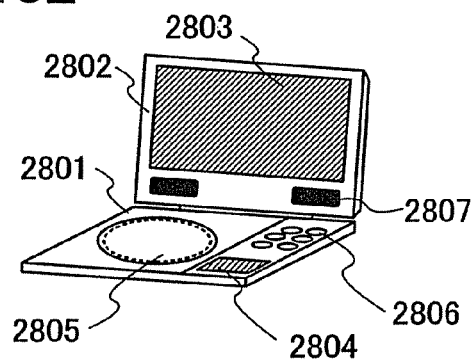

FIG. 18E shows a portable image reproducing device provided with a recording medium (specifically, a DVD reproducing device), which includes a main body 2801, a housing 2802, a display portion A 2803, a display portion B 2804, a recording medium reading portion 2805, operation keys 2806, a speaker portion 2807, and the like. The display portion A 2803 mainly displays image data while the display portion B 2804 mainly displays text data. The present invention can be applied to the display portion A 2803, the display portion B 2804, a control circuit portion, or the like. Note that the recording medium indicates a DVD or the like, and the image reproduction device equipped with the recording medium further includes a home game machine and the like.

By implementing the present invention, an image reproducing device provided with a high-quality display device can be obtained.

Figure 19A:
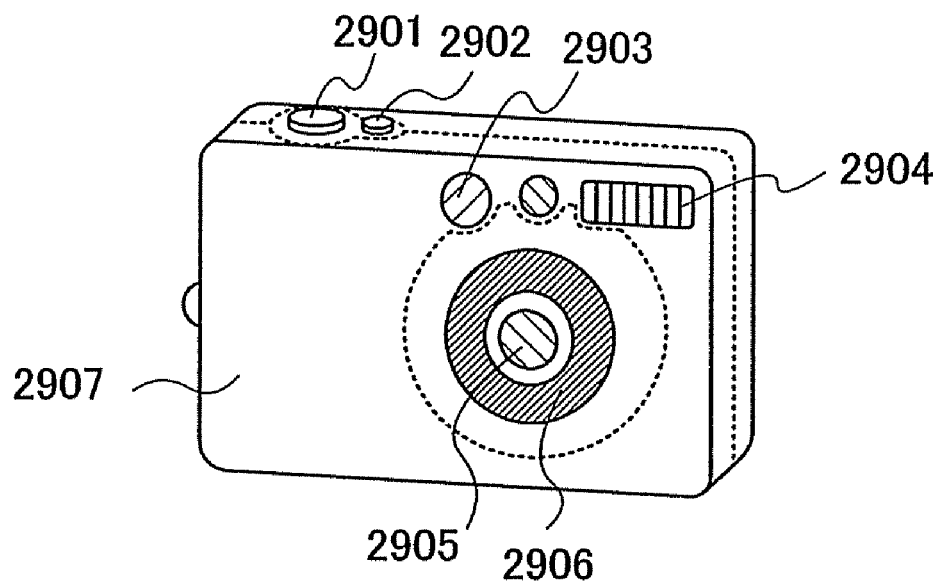
FIGS. 19A and 19B illustrate an example of an electronic appliance to which the present invention is applied.
Figure 19B:
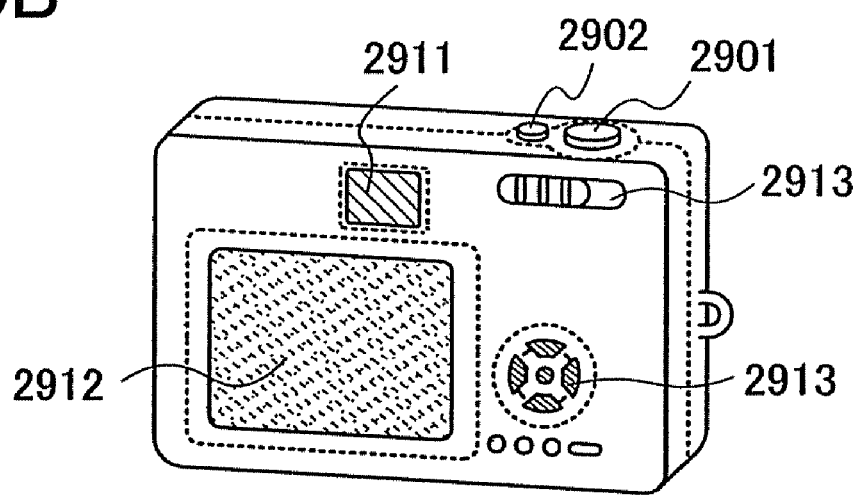

FIGS. 19A and 19B each show an example in which the liquid crystal display device of the present invention is incorporated in a camera, for example, a digital camera. FIG. 19A is a perspective view from the front side of the digital camera, and FIG. 19B is a perspective view from the back side thereof. In FIG. 19A, the digital camera is provided with a release button 2901, a main switch 2902, a viewfinder 2903, a flash portion 2904, a lens 2905, a barrel 2906, and a housing 2907.

In FIG. 19B, an eyepiece finder 2911, a monitor 2912, and operation buttons 2913 are provided.

When the release button 2901 is pushed down to the half point, a focus adjustment mechanism and an exposure adjustment mechanism are operated, and when the release button is pushed down to the lowest point, a shutter button is opened.

By pushing down or rotating the main switch 2902, a power supply of the digital camera is switched on or off.

The viewfinder 2903 is arranged above the lens 2905, which is on the front side of the digital camera, for checking a shooting range and the focus point from the eyepiece finder 2911 shown in FIG. 19B.

The flash portion 2904 is arranged in the upper position on the front side of the digital camera. When the subject brightness is not enough, auxiliary light is emitted from the flash portion 2904, at the same time as the release button 2901 is pushed down and a shutter button is opened.

The lens 2905 is arranged at the front side of the digital camera and made of a focusing lens, a zoom lens, and the like. This lens, in conjunction with a shutter button and a diaphragm (not shown), constitutes an imaging optical system. In addition, behind the lens, an image sensor such as a CCD (Charge Coupled Device) is provided.

The barrel 2906 moves a lens position to adjust the focus of the focusing lens, the zoom lens, and the like. In shooting, the barrel is slid out to move the lens 2905 forward. Further, when carrying the digital camera, the lens 2905 is moved backward to be compact. Note that a structure is employed in this embodiment mode, in which the subject can be photographed by zoom by sliding out the barrel; however, the present invention is not limited to this structure, and a structure may also be employed for the digital camera, in which shooting can be performed by zoom without sliding out the barrel with the use of a structure of a photographic optical system inside the housing 2907.

The eyepiece finder 2911 is arranged in the upper position on the back side of the digital camera for looking therethrough in checking a shooting range and the focus point.

The operation buttons 2913 are buttons for various functions provided on the back side of the digital camera, which includes a set up button, a menu button, a display button, a functional button, a selecting button, and the like.

The liquid crystal display device of the present invention can be incorporated in a monitor 2912 of the camera shown in FIGS. 19A and 19B. Accordingly, a digital camera provided with a high-quality display device can be obtained.

Note that examples shown in this embodiment mode are only exemplary one, and therefore, the present invention is not limited to such applications.

This application is based on Japanese Patent Application serial no. 2007-314123 filed with Japan Patent Office on Dec. 5, 2007, the entire contents of which are hereby incorporated by reference.

What is claimed is:
1. A display device comprising:
  a thin film transistor comprising:
    a gate electrode formed of a first conductive film;
    a gate insulating film formed of a first insulating layer over the gate electrode;
    a first semiconductor layer over the first insulating layer, wherein the first semiconductor layer is overlapped with the gate electrode;
    a channel protective film which is formed of a second insulating layer over the first semiconductor layer, wherein the channel protective film is overlapped with the gate electrode;
    a second semiconductor layer having an impurity element imparting one conductivity type, wherein the second semiconductor layer is overlapped with the first semiconductor layer, wherein the second semiconductor layer is divided into a source region and a drain region, wherein one end portion of the source region and one end portion of the drain region is provided over the channel protective film; and a source electrode over the source region and a drain electrode over the drain region, wherein the source electrode and the drain electrode are formed of a second conductive film;

a third insulating layer formed over the source electrode and the drain electrode;

a pixel electrode formed of a third conductive film over the third insulating layer, wherein the pixel electrode is electrically connected to one of the source electrode and the drain electrode through a contact hole formed in the third insulating layer;

a capacitor wiring formed of a stacked body which includes the first semiconductor layer, the second semiconductor layer, and the second conductive film over the first insulating layer; and a storage capacitor formed of a stacked body which includes the capacitor wiring, the third insulating layer, and the pixel electrode.

2. A display device comprising:

a thin film transistor comprising:

a gate electrode formed of a first conductive film;

a gate insulating film formed of a first insulating layer over the gate electrode;

a first semiconductor layer over the first insulating layer, wherein the first semiconductor layer is overlapped with the gate electrode;

a channel protective film which is formed of a second insulating layer over the first semiconductor layer, wherein the channel protective film is overlapped with the gate electrode;

a second semiconductor layer having an impurity element imparting one conductivity type, wherein the second semiconductor layer is overlapped with the first semiconductor layer, wherein the second semiconductor layer is divided into a source region and a drain region, wherein one end portion of the source region and one end portion of the drain region is provided over the channel protective film; and a source electrode over the source region and a drain electrode over the drain region, wherein the source electrode and the drain electrode are formed of a second conductive film;

a third insulating layer formed over the source electrode and the drain electrode;

a pixel electrode formed of a third conductive film over the third insulating layer, wherein the pixel electrode is electrically connected to one of the source electrode and the drain electrode through a contact hole formed in the third insulating layer;

a capacitor wiring formed of a stacked body which includes the first semiconductor layer, the second semiconductor layer, and the second conductive film over the first insulating layer;

a storage capacitor formed of a stacked body which includes the capacitor wiring, the third insulating layer, and the pixel electrode; and a connection region comprising:

a wiring formed of the first conductive film; and an electrode which is formed of the third conductive film over the wiring and which is in contact with a top surface and a side surface of the other one of the source electrode and the drain electrode.

3. The display device according to claim 1, wherein the third conductive film is a light-transmitting conductive film.

4. The display device according to claim 2, wherein the third conductive film is a light-transmitting conductive film.

* * * * *